(12) United States Patent
Ishibashi et al.

(10) Patent No.: US 8,592,284 B2
(45) Date of Patent: Nov. 26, 2013

(54) SEMICONDUCTOR DEVICE AND MANUFACTURING METHOD THEREOF

(75) Inventors: Masato Ishibashi, Tokyo (JP);
Katsuyuki Horita, Tokyo (JP);
Tomohiro Yamashita, Tokyo (JP);
Takaaki Tsunomura, Tokyo (JP);
Takashi Kuroi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 288 days.

(21) Appl. No.: 12/495,070

(22) Filed: Jun. 30, 2009

(65) Prior Publication Data

US 2010/0044802 A1    Feb. 25, 2010

(30) Foreign Application Priority Data

Aug. 20, 2008 (JP) ................................. 2008-211738

(51) Int. Cl.
*H01L 21/76* (2006.01)

(52) U.S. Cl.
USPC ..... 438/430; 438/431; 257/401; 257/E29.017

(58) Field of Classification Search
USPC .......... 438/430, 431, 432, 424, 439; 257/401, 257/510, E29.017
See application file for complete search history.

(56) References Cited

U.S. PATENT DOCUMENTS

| | | | |
|---|---|---|---|
| 4,353,086 A * | 10/1982 | Jaccodine et al. | ............ 257/301 |
| 5,332,683 A | 7/1994 | Miyashita et al. | |
| 6,133,116 A * | 10/2000 | Kim et al. | ...................... 438/430 |
| 6,255,704 B1 | 7/2001 | Iwata et al. | |
| 6,396,113 B1 | 5/2002 | Fujinaga et al. | |
| 6,750,526 B2 * | 6/2004 | Nakashima | ................... 257/509 |

(Continued)

FOREIGN PATENT DOCUMENTS

| | | |
|---|---|---|
| CN | 1421914 A | 6/2003 |
| CN | 101010787 A | 8/2007 |

(Continued)

OTHER PUBLICATIONS

Sim, J., et al., "The Impact of Isolation Pitch Scaling on $V_{TH}$ Fluctuation in DRAM Cell Transistors due to Neighboring Drain/Source Electric Field Penetration", Symposium on VLSI Technology Digest of Technical Papers, 1998, pp. 32-33.

(Continued)

*Primary Examiner* — Chuong A Luu
*Assistant Examiner* — Nga Doan
(74) *Attorney, Agent, or Firm* — McDermott Will & Emery LLP

(57) ABSTRACT

Provided are a semiconductor device making it possible to form an element region having a dimension close to a designed dimension, restrain a phenomenon similar to gate-induced drain leakage, and further restrain compressive stress to be applied to the element region by oxidation of a conductive film; and a method for manufacturing the semiconductor device. Trenches are made in a main surface of a semiconductor substrate. By oxidizing the wall surface of each of the trenches, a first oxide film is formed on the wall surface. An embedded conductive film is formed to be embedded into the trench. The embedded conductive film is oxidized in an atmosphere containing an active oxidizing species, thereby forming a second oxide film. A third oxide film is formed on the second oxide film by CVD or coating method.

6 Claims, 20 Drawing Sheets

(56) References Cited

U.S. PATENT DOCUMENTS

| | | | |
|---|---|---|---|
| 7,196,396 B2 | 3/2007 | Ohta | |
| 7,507,628 B2 | 3/2009 | Hong et al. | |
| 7,939,422 B2 * | 5/2011 | Ingle et al. | 438/435 |
| 2003/0094669 A1 | 5/2003 | Nakashima | |
| 2006/0228852 A1 * | 10/2006 | Chien | 438/238 |
| 2006/0246698 A1 * | 11/2006 | Yao et al. | 438/591 |
| 2007/0241373 A1 | 10/2007 | Kuroi et al. | |
| 2009/0053903 A1 | 2/2009 | Kobayashi et al. | |

FOREIGN PATENT DOCUMENTS

| | | |
|---|---|---|
| EP | 1786030 A1 | 5/2007 |
| JP | 01-245538 | 9/1989 |
| JP | 01-260840 | 10/1989 |
| JP | 02-174140 | 7/1990 |
| JP | 02-226742 | 9/1990 |
| JP | 03-183152 | 8/1991 |
| JP | 04-209551 | 7/1992 |
| JP | 10-022462 | 1/1998 |
| JP | 2000-31268 | 1/2000 |
| JP | 2001-148418 | 5/2001 |
| JP | 2003-158178 A | 5/2003 |
| JP | 2004-207564 | 7/2004 |
| JP | 2007-115948 A | 5/2007 |
| JP | 2008-118094 A | 5/2008 |
| WO | 2006/025363 A1 | 3/2006 |
| WO | WO 2006/046442 A1 | 5/2006 |

OTHER PUBLICATIONS

Japanese Office Action, and English translation thereof, issued in Japanese Patent Application No. 2008-211738 dated May 7, 2013.
Chinese Office Action, and English translation thereof, issued in Chinese Patent Application No. 200910151047.7 dated Feb. 5, 2013.

* cited by examiner

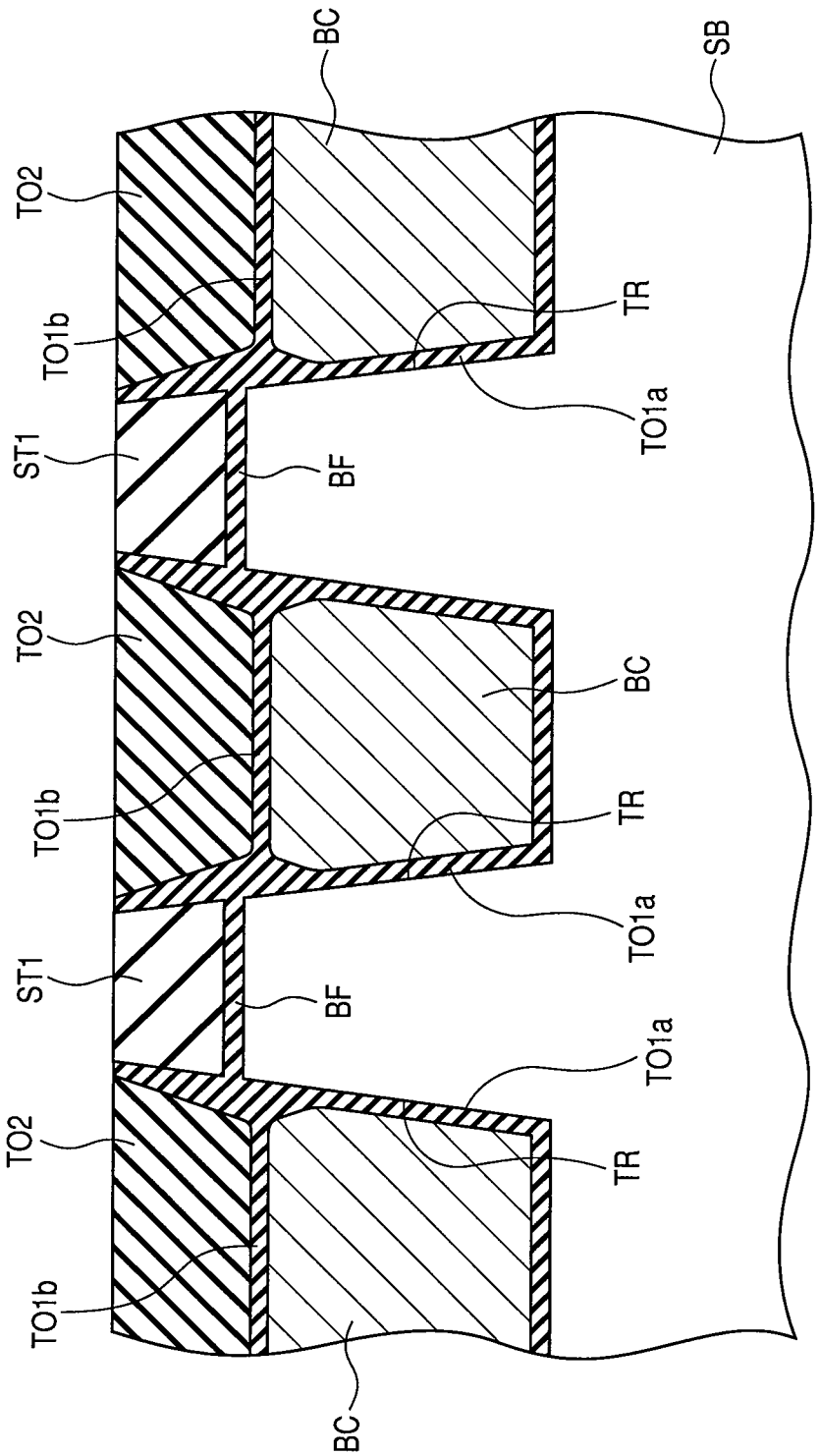

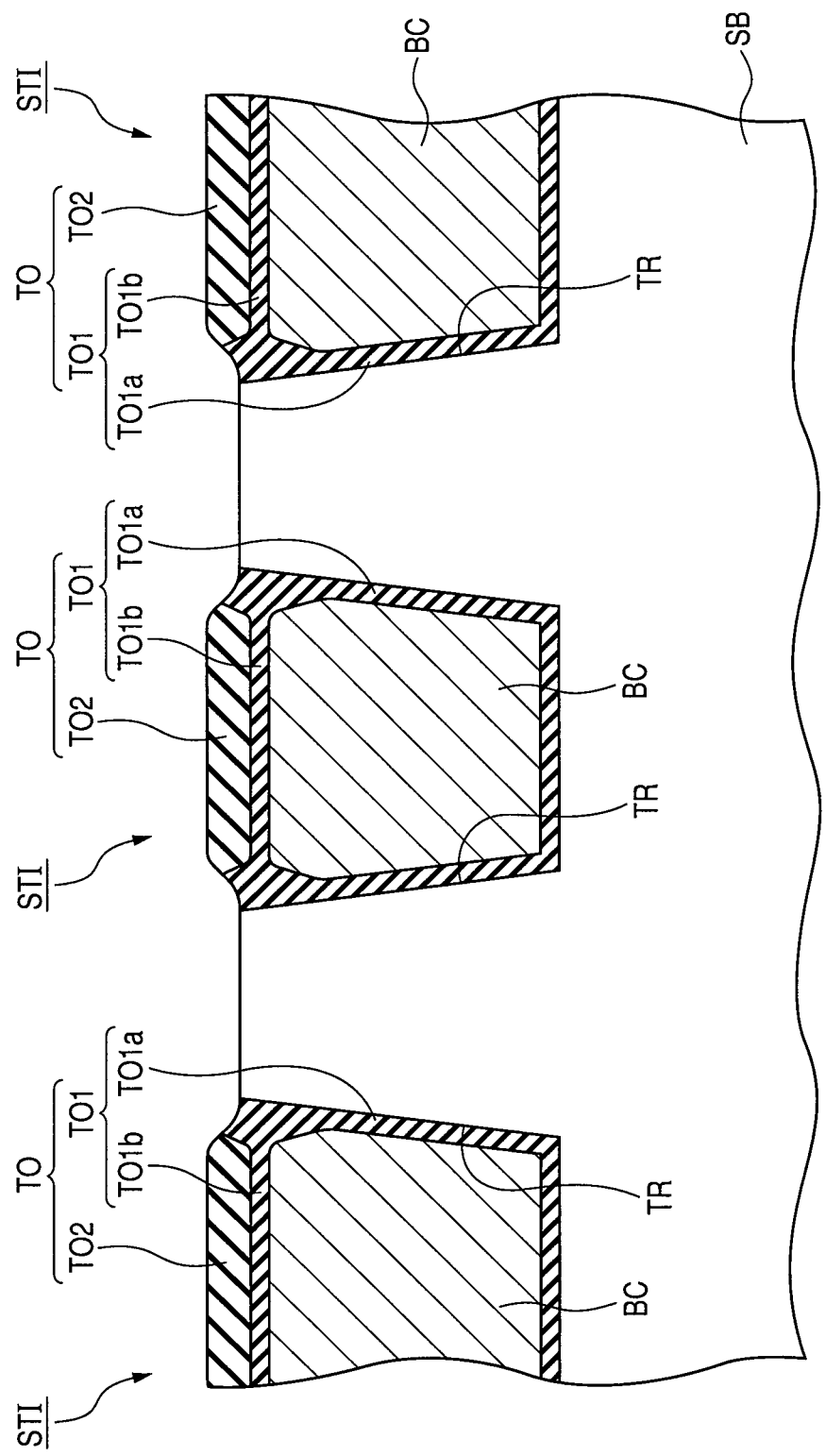

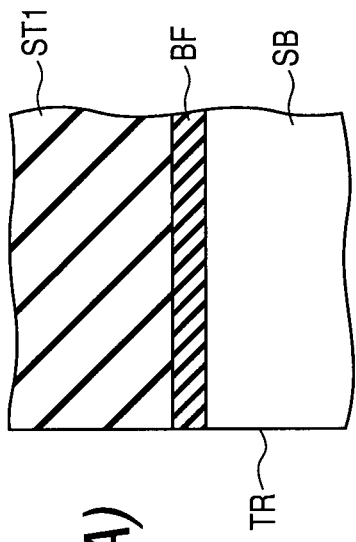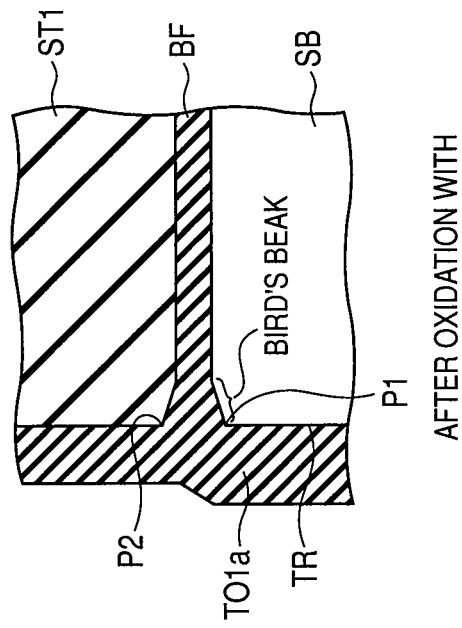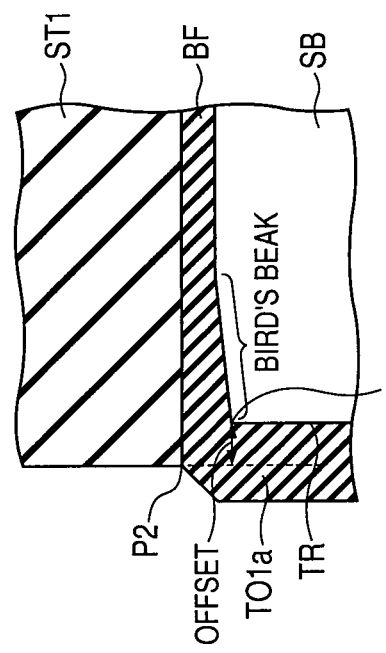

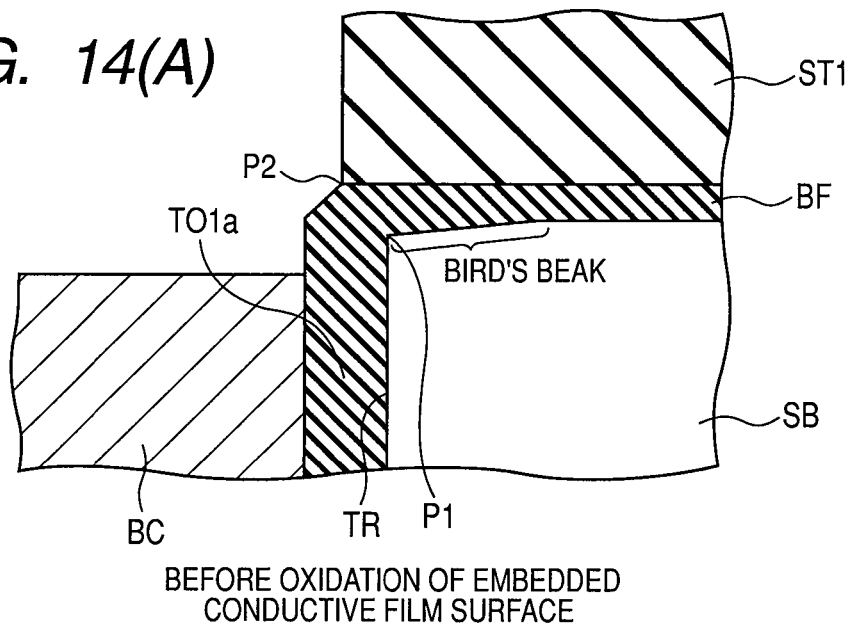
FIG. 14(A) BEFORE OXIDATION OF EMBEDDED CONDUCTIVE FILM SURFACE
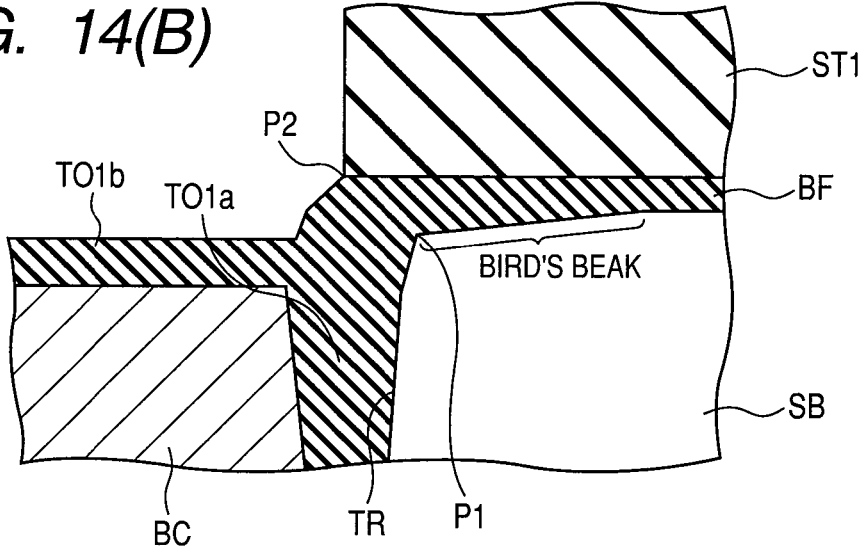
FIG. 14(B) AFTER ORDINARY THERMAL OXIDATION OF EMBEDDED CONDUCTIVE FILM SURFACE

BEFORE OXIDATION OF EMBEDDED
CONDUCTIVE FILM SURFACE

AFTER OXIDATION OF EMBEDDED CONDUCTIVE FILM
SURFACE WITH ACTIVE OXIDIZING SPECIES

SEMICONDUCTOR DEVICE AND MANUFACTURING METHOD THEREOF

CROSS-REFERENCE TO RELATED APPLICATIONS

The disclosure of Japanese Patent Application No. 2008-211738 filed on Aug. 20, 2008 including the specification, drawings and abstract is incorporated herein by reference in its entirety.

BACKGROUND OF THE INVENTION

The present invention relates to a semiconductor device, and a manufacturing method thereof.

As semiconductor integrated circuits have been rapidly made minuter in recent years, the density thereof has been becoming higher. Following this phenomenon, about cutting-edge integrated circuits, their element isolation regions have been required to be made minuter while their element isolating capability is kept in order to increase the integration degree per unit area.

In response to such requirements that the element isolation regions should be made minuter, the trench isolation method has been widely used as an element isolation method instead of a conventional LOCOS (local oxidation of silicon) method. The trench isolation method is a method of embedding an insulating film into a trench made between elements, thereby attaining electric isolation between the elements. According to this element isolation technique (or element isolating technique), the integration degree is easily made high.

However, on the basis of requirements that integrated circuits should made still minuter, the width of trenches is made equivalent to the thickness of conventional gate insulating films. As a result, element isolation based on embedment with insulating films has been approaching the limit thereof. In particular, a problem about a change in electric potential of neighboring nodes is caused. This problem is described in, for example, J. Sim et al., "The Impact of Isolation Pitch Scaling on Vth Fluctuation in DRAW Cell Transistors due to Neighboring Drain/Source Electric Field Penetration", Symposium on VLSI Technology Digest of Technical Papers, 1998, pp. 32-33 (Non-Patent Document 1).

As a method for solving such a problem, there is known field shield STI (shallow trench isolation). The field shield STI is a method of embedding, into a trench between elements, not an insulating film but a conductive film, and then fixing the electric potential of the conductive film, thereby realizing isolation between the elements. As this conductive film, there is frequently used a polycrystal silicon film doped with an impurity, which will be referred to as a "doped polysilicon film" hereinafter, from the viewpoint of the simplicity of the production process, and others.

In the meantime, according to the trench isolation method, trenches are made by etching a silicon substrate anisotropically; thus, edges of the resultant element regions are each made into a shape having an angle. An electric field from a gate electrode is concentrated into such an angular portion. For this reason, a channel portion formed into the angular portion more easily turns on than other portions of the channel. In particular, as the width of the channel is made smaller, the property of the angular portion jointed to the tip of the channel becomes more preferential. Thus, the threshold value of the transistor becomes lower as the channel width is made smaller. This phenomenon is known as the reverse narrow channel effect, and deteriorates the performance of semiconductor devices.

As elements have been made minuter, a reduction in channel width has been rapidly advancing; thus, the decline in the threshold value has been increasingly becoming a more serious problem. The reverse narrow channel effect can be decreased by a matter that the above-mentioned field shield STI method is used to change the electric potential of an embedded conductive film and control the electric potential of angular portions of element region edges.

Field shield STI as described above is described in, for example, Japanese Unexamined Patent Publication Nos. Hei 10 (1998)-22462, Hei 1 (1989)-245538, Hei 2 (1990)-174140, and Hei 1 (1989)-260840 (Patent Documents 1, 2, 3, and 4, respectively). In the techniques described in these documents, a cap insulating layer for restraining a short circuit is formed on a conductive layer embedded in trenches by thermal oxidation.

SUMMARY OF THE INVENTION

In a case where in the field shield STI the height of the upper surface of a conductive film is low, the effect of shielding an electric field is not sufficiently obtained or the application of a large voltage becomes necessary at the time of controlling the electric potential of angular portions in element region edges. This results in a problem that a leakage current is generated in a silicon oxide film between the conductive film and the silicon substrate or the reliability of the silicon oxide film deteriorates, and other problems. Therefore, in order to use the field shield STI method to restrain a change in the electric potential of neighboring nodes or a reverse narrow channel effect, it is necessary to raise the height of the upper surface of the embedded conductive film to some degree.

However, when the upper surface height of the embedded conductive film is raised, there is caused a phenomenon similar to GIDL (gate-induced drain leakage) generated in ordinary transistors. In other words, when the upper surface height of the embedded conductive film is raised, the distance between the embedded conductive film and the corresponding source and/or drain becomes short so that the electric field therebetween becomes large. In this way, a leakage current flows which depends on the electric potential of the embedded conductive film between the source and/or drain regions and the silicon substrate, so as to cause a phenomenon that an electric current increases in an area where the voltage of field transistors is off.

When upper angular portions of the silicon substrate and the embedded conductive film are oxidized in an oxidizing step such as a gate oxidizing step, a large compressive stress is applied to the element regions. This compressive stress has an effect of amplifying the phenomenon similar to GIDL.

Furthermore, this compressive stress induces a new problem of dependency of the drain current onto the layout of the transistor. When the distance between the boundary between a source side element region and the element isolation region and the boundary between the corresponding drain side element region and the element isolation region is called the LOD (length of oxide definition), the transistor layout dependency is a property that the drain current depends on the LOD. About an n type MOS transistor, in a layout wherein the LOD is small, compressive stress onto a channel region based on an embedded conductive film in a trench becomes large so that the drain current is unfavorably decreased. When such a layout dependency of the drain current exists, a load onto circuit design becomes large and further the performance of integrated circuits deteriorates largely.

In case of attempting to form a cap insulating layer having a thickness sufficient for restraining a short circuit as described in Patent Documents 1 to 4 by thermal oxidation, oxidation advances largely also in the direction along the surfaces of the semiconductor substrate (the horizontal direction). Thus, the thickness of the silicon oxide film between the source and/or drain regions and the embedded conductive film becomes very large so that an element region having a dimension close to a designed dimension is not easily formed.

An object of the present invention is to provide a semiconductor device making it possible to form an element region having a dimension close to a designed dimension, restrain a phenomenon similar to GIDL as described above, and further restrain compressive stress to be applied to the element region by oxidation of a conductive film; and manufacturing method of the semiconductor device.

The semiconductor device manufacturing method of an aspect of the present invention includes the following steps: a mask layer is formed selectively over a main surface of a semiconductor substrate; a trench is made in the main surface of the semiconductor substrate where the mask layer is not formed; the wall surface of the trench is oxidized to form a first oxide film; an embedded conductive film is formed to be embedded into the trench; the embedded conductive film is oxidized in an atmosphere containing an active oxidizing species, thereby forming a second oxide film; and a third oxide film is formed over the second oxide film.

According to the semiconductor device manufacturing method of the aspect of the present invention, a second oxide film is formed by oxidizing an embedded conductive film in an atmosphere containing an active oxidizing species. Since this active oxidizing species has kinetic energy, the oxidation advances more rapidly under a smaller thermal energy than in an ordinary thermal oxidation step. For this reason, when the embedded conductive film is oxidized, the diffusion of the oxidizing species can be restrained so as to restrain oxidation from advancing largely in the direction along the main surfaces of the semiconductor substrate (the horizontal direction). Thus, an element region having a dimension close to a designed dimension can be obtained.

Moreover, when the embedded conductive film is oxidized in the active-oxygen-species-containing atmosphere, an angular portion of the upper end of the embedded conductive film can be deeply oxidized. For this reason, the interval between the embedded conductive film and impurity regions formed in the semiconductor substrate can be made large so that an electric field therebetween can be made small. Thus, the generation of a phenomenon similar to GIDL can be prevented.

This third oxide film is preferably formed by chemical vapor deposition or coating method. When the third oxide film is formed by chemical vapor deposition or coating method, the film comes to have a film quality not denser than the second oxide film formed by oxidation. In this way, the third oxide film comes to have tensile stress in reverse to the second oxide film. As a result, the compressive stress generated by oxidation for forming the second oxide film can be relieved by the tensile stress of the third oxide film. For this reason, the compressive stress applied to the element region can be restrained.

BRIEF DESCRIPTION OF THE DRAWINGS

FIG. 11 is a schematic sectional view illustrating a ninth step of the manufacturing method.

FIG. 12 is a schematic sectional view illustrating a tenth step of the manufacturing method.

FIGS. 13(A) to 13(C) are views illustrating situations of the formation of oxide films in the oxidation step illustrated in FIG. 5, in which FIG. 13(A) is a view illustrating a state before any oxidation, FIG. 13(B) is a view illustrating a state when ordinary thermal oxidation is conducted, and FIG. 13(C) is a view illustrating a state when thermal oxidation using an active oxidizing species is conducted, and FIGS. 13(A) to 13(C) are each an enlarged, schematic sectional view illustrating a region P0 in FIGS. 4 and 5.

FIGS. 14(A) and 14(B) are schematic sectional views illustrating a situation of the formation of oxide films in the oxidation step illustrated in FIGS. 8 and 9 after the step illustrated in FIG. 13(B), in which FIG. 14(A) is a schematic sectional view illustrating a state before any oxidation, and FIG. 14(B) is a schematic sectional view illustrating a state when ordinary thermal oxidation is conducted.

FIGS. 15(A) and 15(B) are schematic sectional views illustrating a situation of the formation of oxide films in the oxidation step illustrated in FIGS. 8 and 9 after the step illustrated in FIG. 13(C), in which FIG. 15(A) is a schematic sectional view illustrating a state before any oxidation, and FIG. 15(B) is a schematic sectional view illustrating a state when thermal oxidation is conducted in an atmosphere containing an active oxidizing species.

FIG. 16(A) is a view illustrating a situation after ordinary thermal oxidation as illustrated in FIG. 13(B) and FIGS. 14(A) and 14(B) is conducted, the step illustrated in FIG. 11 is conducted and then a silicon nitride film ST1 is removed.

FIG. 17(A) is a view illustrating a situation after active-oxidizing-species-used thermal oxidation as illustrated in FIG. 13(C) and FIGS. 15(A) and 15(B) is conducted, the step illustrated in FIG. 11 is conducted and then a silicon nitride film ST1 is removed.

DETAILED DESCRIPTION OF THE PREFERRED EMBODIMENTS

Figure 1:
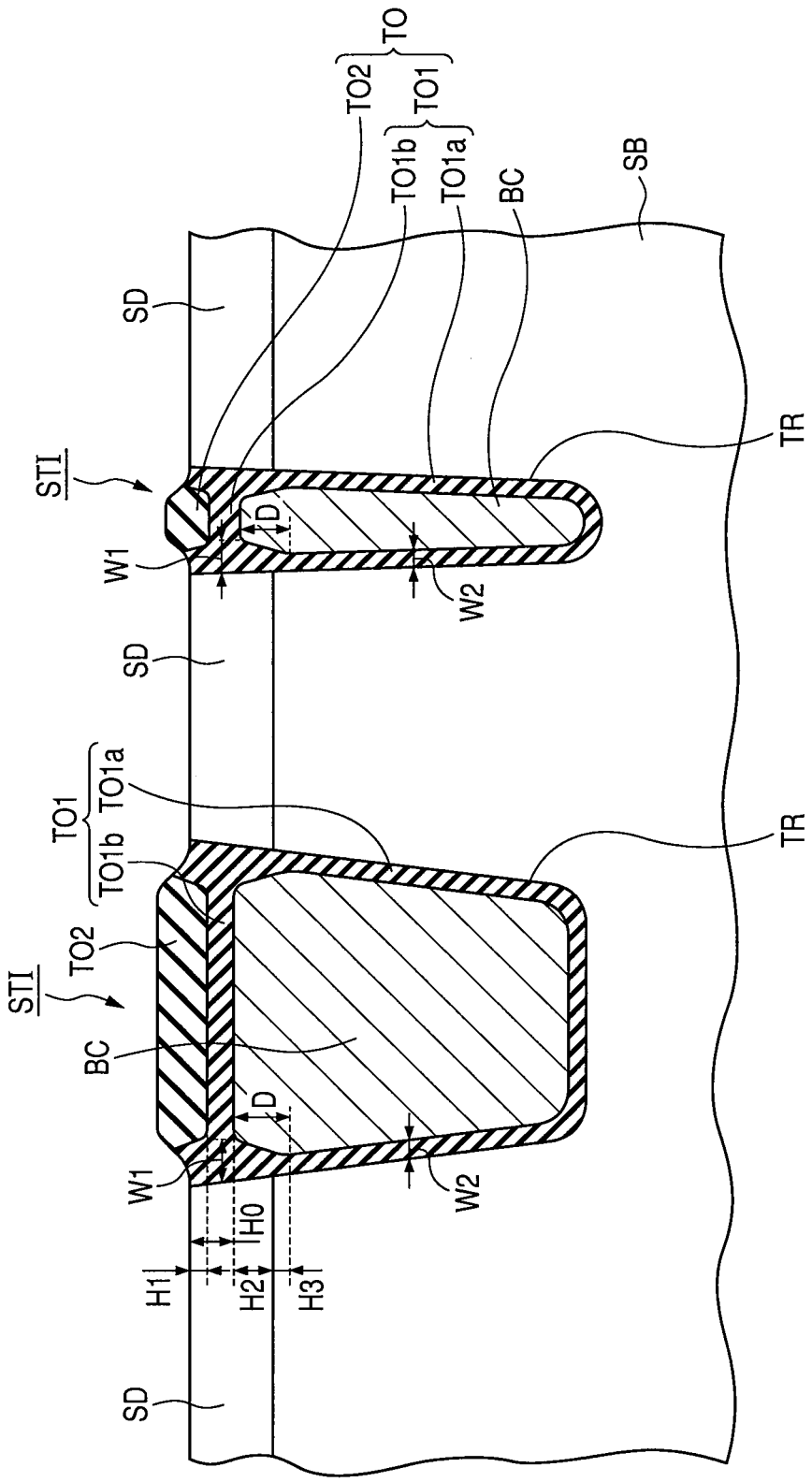
FIG. 1 is a sectional view which schematically illustrates the structure of a semiconductor device of an embodiment 1 of the invention.

With reference to the attached drawings, embodiments of the present invention will be described hereinafter.
Embodiment 1:

FIG. 1 is a sectional view which schematically illustrates the structure of a semiconductor device of an embodiment 1 of the invention. Referring to FIG. 1, for example, element isolation structures STIs based on field shield STI are formed in a main surface of a semiconductor substrate SB made of silicon. The element isolation structures STIs each have a trench TR, a first oxide film TO1$a$, an embedded conductive film BC, a second oxide film TO1$b$, and a third oxide film TO2.

The trench TR is made in the main surface of the semiconductor substrate SB. The first oxide film TO1$a$ is formed to cover the wall surface of the trench TR. The first oxide film TO1$a$ is, for example, a silicon oxide film formed by oxidizing the surface of the semiconductor substrate SB thermally in an atmosphere containing an active oxidizing species.

The embedded conductive film BC is embedded into the trench TR, the wall surface of which is covered with the first oxide film TO1$a$, and is, for example, a doped polysilicon film. The upper end of this embedded conductive film BC is positioned below the main surface of the semiconductor substrate SB (i.e., is positioned toward the substrate surface opposite to the main surface) by a distance H0.

The second oxide film TO1$b$ is formed to contact the upper end of the embedded conductive film BC and further cover the upper surface of the embedded conductive film BC. This second oxide film TO1$b$ is, for example, a silicon oxide film formed by oxidizing the embedded conductive film BC thermally in an atmosphere containing an active oxidizing species. The second oxide film TO1$b$ is jointed to the first oxide film TO1$a$, and is combined with the first oxide film TO1$a$ to configure an oxide film TO1.

The third oxide film TO2 is formed selectively only on the second oxide film TO1$b$ to contact the upper surface of the second oxide film TO1$b$. This third oxide film TO2 is, for example, a silicon oxide film formed by chemical vapor deposition (CVD) method or coating method, and has a film quality not denser than the second oxide film TO1$b$.

The oxide film TO1 and the third oxide film TO2 form an oxide film TO contained in the ST1. In particular, the second oxide film TO1$b$ and the third oxide film TO2 form a cap insulating film for capping the upper surface of the embedded conductive film BC.

In the element isolation structure STI, an upper end corner portion of the embedded conductive film BC has a shape which does not have any angle. In this manner, the width (film thickness) W1 of the first oxide film TO1$a$ between the embedded conductive film BC and the semiconductor substrate BS is gradually made smaller from the upper toward the lower in the upper end corner portion of the embedded conductive film BC, so that the first oxide film TO1$a$ is made in a tapered form.

The dimension D of this tapered shape in the depth direction is larger than the largest width W1 of the tapered shape, which is the width of the top of the tapered shape, so that the shape becomes a vertical bird's beak, which is a bird's beak extending to the depth direction. The width W1 of the tapered shape is larger than the width (film thickness) W2 of the first oxide film TO1$a$ portion corresponding to any other portion than the upper end corner portion of the embedded conductive film BC.

By means of the element isolation structures STI, the main surface of the semiconductor substrate SB is isolated into plural electrically-isolated element regions. In each of the electrically-isolated element regions, for example, impurity regions SD, such as a source and/or a drain of a MOS (metal oxide semiconductor), are formed.

In each of the structures STI, the bottom of the interface (boundary) between the above-mentioned second oxide film TO1$b$ and the third oxide film TO2 is positioned below the main surface of the semiconductor substrate SB (i.e., is positioned toward the substrate surface opposite to the main surface) by a distance H1. The upper end of the embedded conductive film BC is positioned over the lower end of the impurity regions SD (i.e., is positioned toward the main surface of the semiconductor substrate SB) by a distance H2. The lower end portion of the tapered shape thereof is preferably positioned below the lower end of the impurity regions SD by a distance H3.

In order that both of the silicon oxide film TO1$b$ and the silicon oxide film TO2 will not be removed by etching or the like in a subsequent step, it is preferred that the total film thickness of the silicon oxide film TO1$b$ and the silicon oxide film TO2 is about 50 nm.

The second oxide film TO1$b$, which is formed by thermal oxidation, and the third oxide film TO2, which is formed by CVD, can be distinguished from each other by, for example, wet etching. In other words, the second oxide film TO1$b$, which is formed by thermal oxidation, has a denser film quality than the third oxide film TO2, which is formed by CVD; therefore, when the semiconductor device is etched with, for example, hydrofluoric acid (HF) as a chemical liquid, the etching-based retreat amount of the second oxide film TO1$b$, which is formed by thermal oxidation, is smaller than that of the third oxide film TO2, which is formed by CVD. Thus, it can be known from the retreat amount whether any one of the oxide films in the device is the second oxide film TO1$b$, which is formed by thermal oxidation, or the third oxide film TO2, which is formed by CVD. The same matter can also be applied to a case where the third oxide film is formed by coating method.

The following will describe the structure of a device where the present element isolation structure STIs, which have been illustrated in FIG. 1, are used to isolate MOS transistors electrically from each other.

Figure 2:
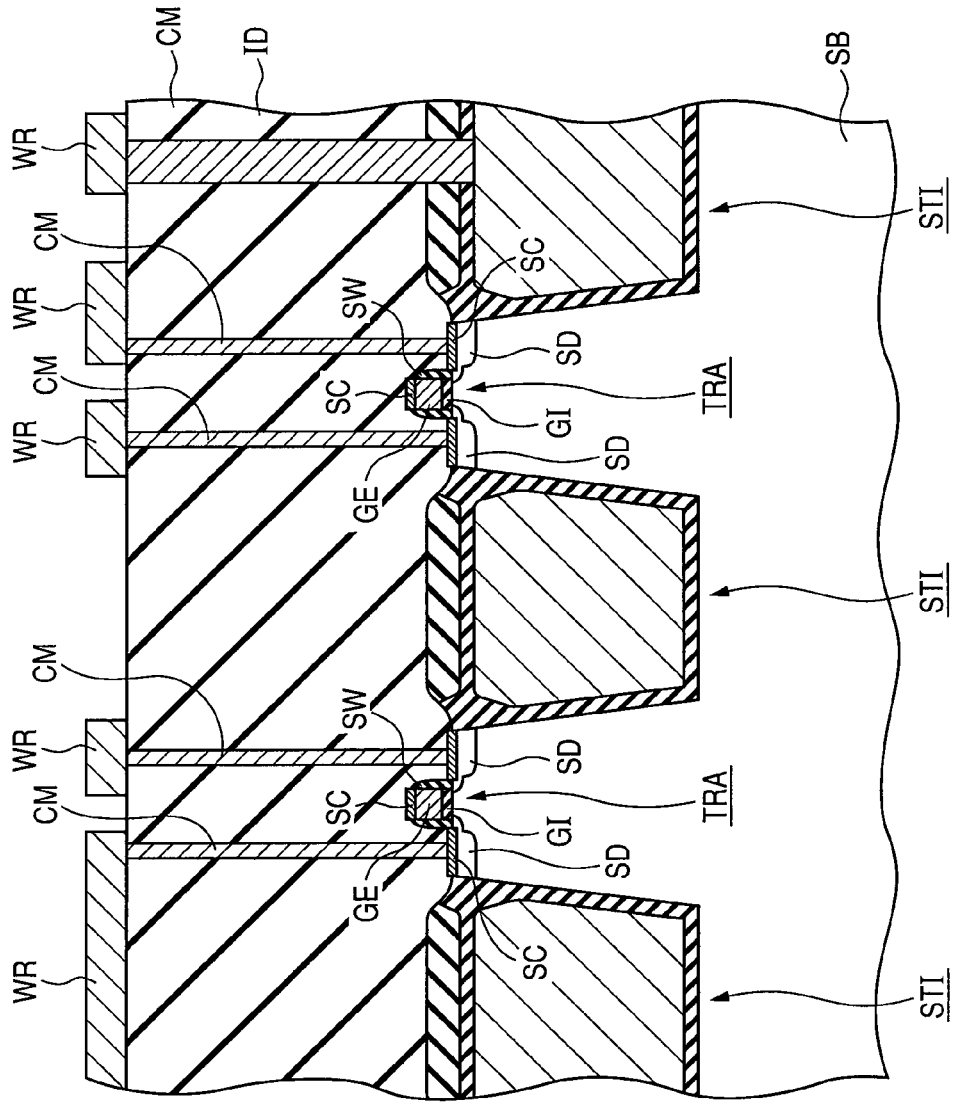
FIG. 2 is a sectional view which schematically illustrates a structure wherein the element isolation structures illustrated in FIG. 1 are used to isolate MOS transistors electrically from each other.

FIG. 2 is a sectional view which schematically illustrates the device structure. Referring to FIG. 2, element regions of a semiconductor substrate are electrically isolated from each other by means of the element isolation structures STIs illustrated in FIG. 1. In each of the element regions, a MOS transistor TRA, which is each of the MOS transistors, is formed.

This MOS transistor TRA mainly has a pair of source and/or drain regions SD, a gate insulating film GI, and a gate electrode layer GE. The source and/or drain pair regions SD are formed in the main surface (element region surface) of the semiconductor substrate SB, so as to have an interval therebetween. The source and/or drain pair regions SD each have an LDD (lightly doped drain) structure, which is made of a combination of a low concentration region with a high concentration region. The gate electrode layer GE is formed over the region of the semiconductor substrate SB sandwiched between the source and/or drain pair regions in such a manner that the gate insulating layer GI is interposed between the layer GE and the region of the substrate SB. A side wall film SW is formed to cover the side wall of the gate electrode layer GE.

An interlayer dielectric ID is formed on the main surface of the semiconductor substrate SB to cover the MOS transistor TRA (i.e., each of the MOS transistors TRA). On this interlayer dielectric ID, plural wiring layers WR are formed. Each of the wiring layers WR is coupled electrically to one of the source and/or drain regions, or the embedded conductive film BC through a conductive film (contact plug) CM embedded into a contact hole made in the interlayer dielectric ID.

Figure 3:
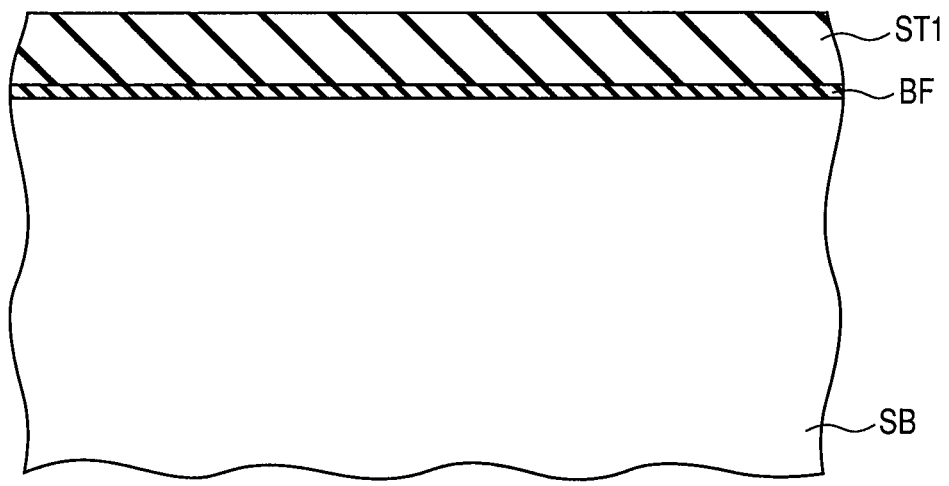
FIG. 3 is a schematic sectional view illustrating a first step of a manufacturing method of the semiconductor device of the embodiment 1 of the invention.

With reference to FIGS. 3 to 12, a method for manufacturing the semiconductor device of the present embodiment 1 of the invention will be described hereinafter. FIGS. 3 to 12 are schematic sectional views which illustrate the process in order of steps therein. Referring to FIG. 3, a silicon oxide film BF is formed into a thickness of about 5 to 15 nm on the main surface of the semiconductor substrate SB made of, for example, silicon by thermal oxidation. A silicon nitride film ST1 is formed into a thickness of about 50 to 250 nm on the silicon oxide film BF by CVD. At this time, the formation of the silicon oxide film BF is attained to relieve stress generated by forming the silicon nitride film ST1 directly onto the silicon substrate SB, thereby avoiding crystal defects and so on.

A photoresist (not illustrated) is painted onto the silicon nitride film ST1, and then the photoresist is patterned by ordinary photolithography. The resist pattern is used as a mask to subject the silicon nitride film ST1, the silicon oxide film BF and the silicon substrate SB over regions where element isolation structures are to be formed to anisotropic etching. At this time, by the anisotropic etching, the silicon nitride film ST1 is first patterned, and further the silicon oxide film BF and the semiconductor substrate SB in the regions where the silicon nitride film ST1 are removed are selectively removed. Thereafter, the resist pattern is removed by, for example, ashing.

Figure 4:
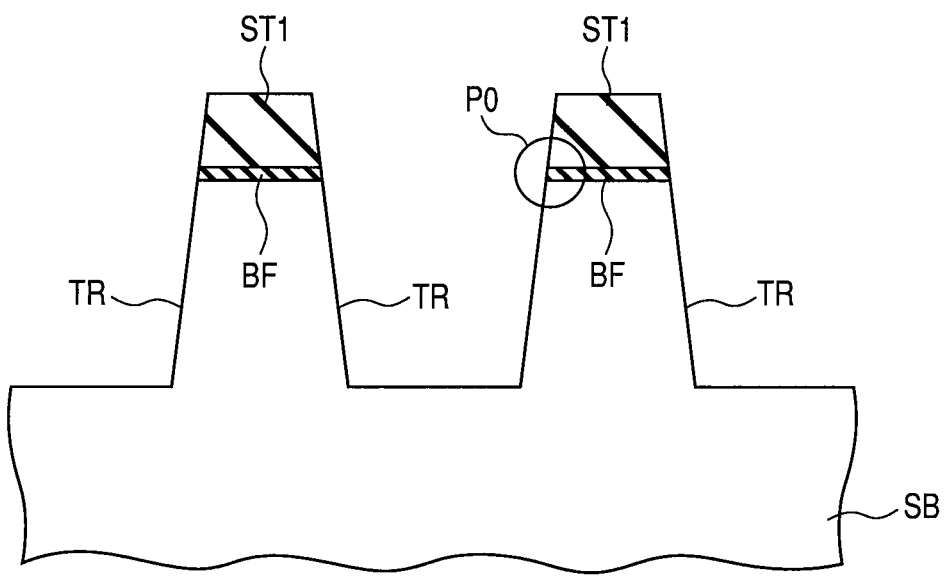
FIG. 4 is a schematic sectional view illustrating a second step of the manufacturing method.

Referring to FIG. 4, by the anisotropic etching, the silicon nitride film ST1 and the silicon oxide film BF are patterned, and further trenches TR are made in the semiconductor substrate SB. The opening width of the trenches TR is, for example, from about 20 to 500 nm. The depth of the trenches TR is, for example, from 100 to 500 nm.

Figure 5:
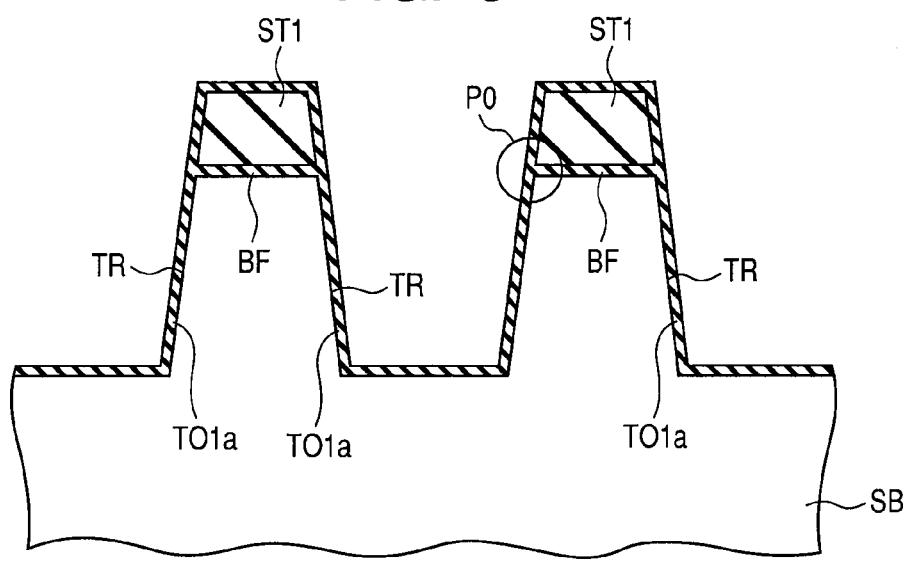
FIG. 5 is a schematic sectional view illustrating a third step of the manufacturing method.

Referring to FIG. 5, the workpiece is thermally oxidized in, for example, an atmosphere containing an active oxidizing species. The oxidation is performed in, for example, high density plasma (HDP). In this manner, the silicon oxide film TO1, which has a thickness of, for example, about 2 to 20 nm, is formed on the wall surfaces of the trenches TR and the exposed surfaces of the silicon oxide film BF and the silicon nitride film ST1. By the oxidation, the damaged layer resulting from the etching is removed.

The active oxidizing species has kinetic energy as an energy other than thermal energy. The kinetic energy contributes to the cleavage of bonds of Si (silicon). The active oxidizing species has, for example, a form of radicals or plasma. The machine for conducting the oxidation may be an internal combustion type of oxidizing machine. According to this machine, combustion reaction between hydrogen and oxygen can be generated in its chamber or tube.

Figure 6:
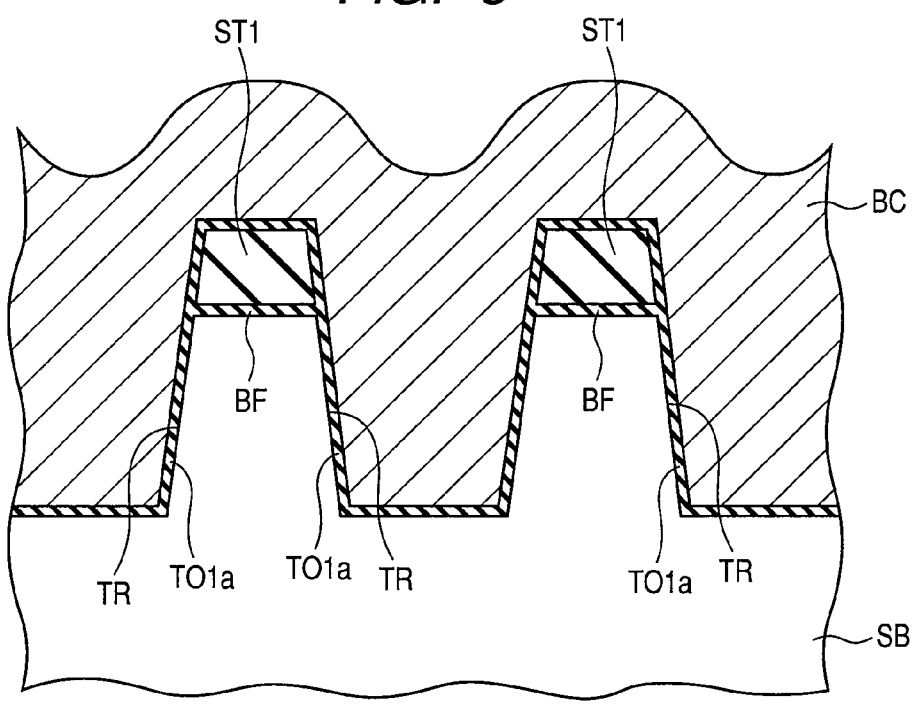
FIG. 6 is a schematic sectional view illustrating a fourth step of the manufacturing method.

Referring to FIG. 6, a doped polysilicon film BC is formed into a film thickness of, for example, 300 to 70 nm by CVD, so as to be embedded into the trenches TR. The surface of the doped polysilicon film BC is subjected to CMP (chemical mechanical polishing) wherein the silicon nitride film ST1 is used as a stopper.

Figure 7:
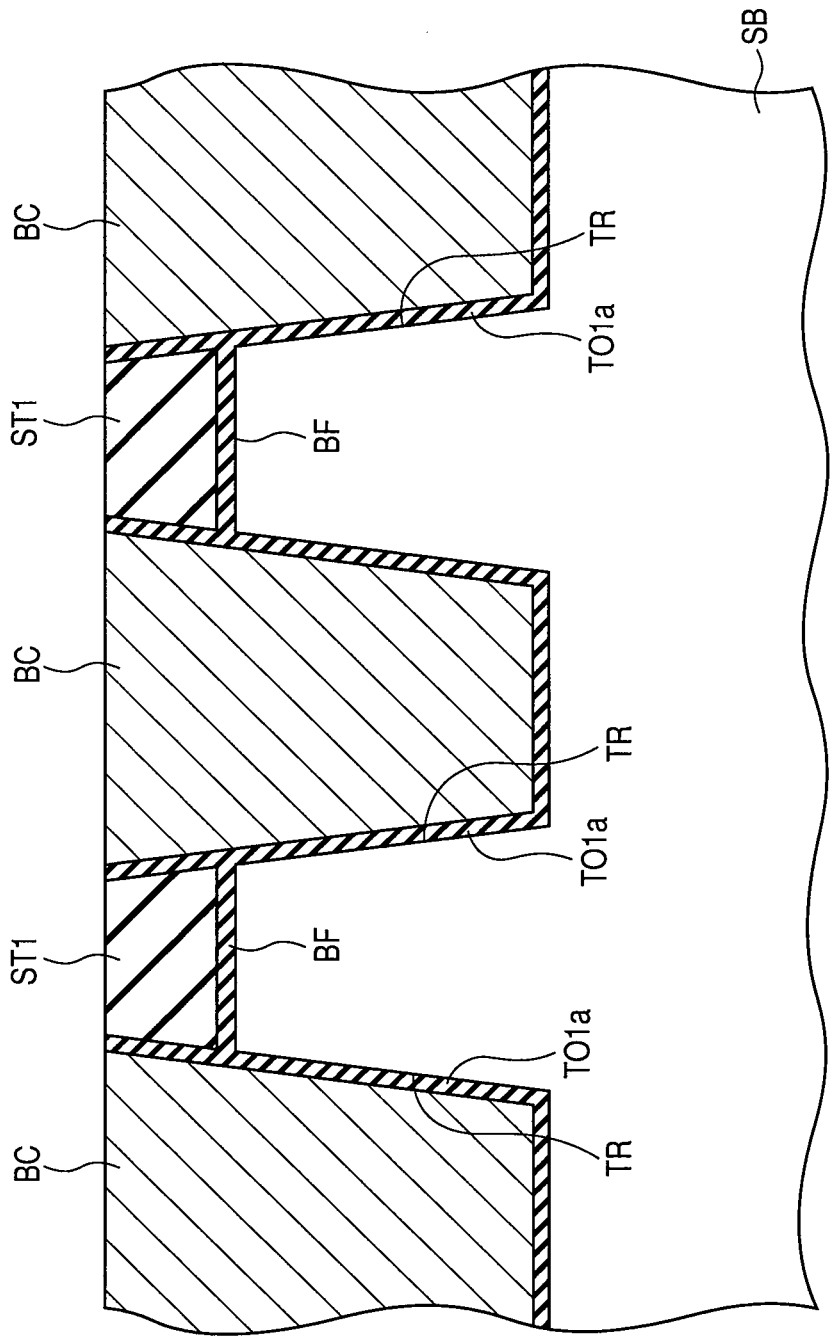
FIG. 7 is a schematic sectional view illustrating a fifth step of the manufacturing method.

Referring to FIG. 7, according to the CMP, the surface of the silicon nitride film ST1 is exposed and further the doped polysilicon film BC remains only in the trenches TR, so that the surfaces of the doped polysilicon film BC and the silicon nitride film ST1 are planarized. Thereafter, the doped polysilicon film BC remaining in the trenches TR is subjected to anisotropic etching.

Figure 8:
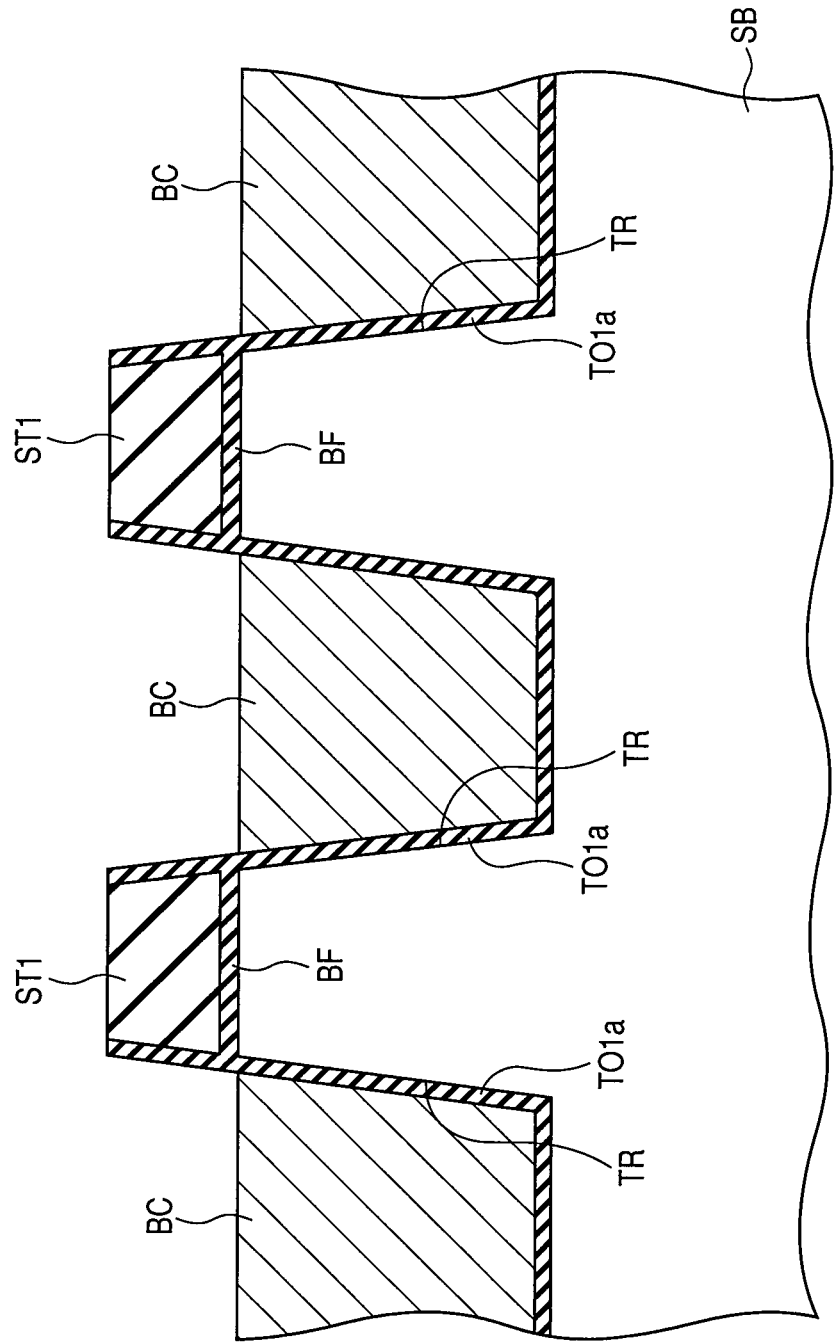
FIG. 8 is a schematic sectional view illustrating a sixth step of the manufacturing method.

Referring to FIG. 8, the anisotropic etching is performed until the upper surface of the doped polysilicon film BC gets lower than the main surface of the silicon substrate. This is necessary for forming minute gate electrodes in a subsequent step, or preventing a short circuit between the gate electrodes and the embedded conductive film, which is the doped polysilicon film BC. According to the anisotropic etching, the embedded conductive film BC, which is the doped polysilicon film BC, is formed.

Figure 9:
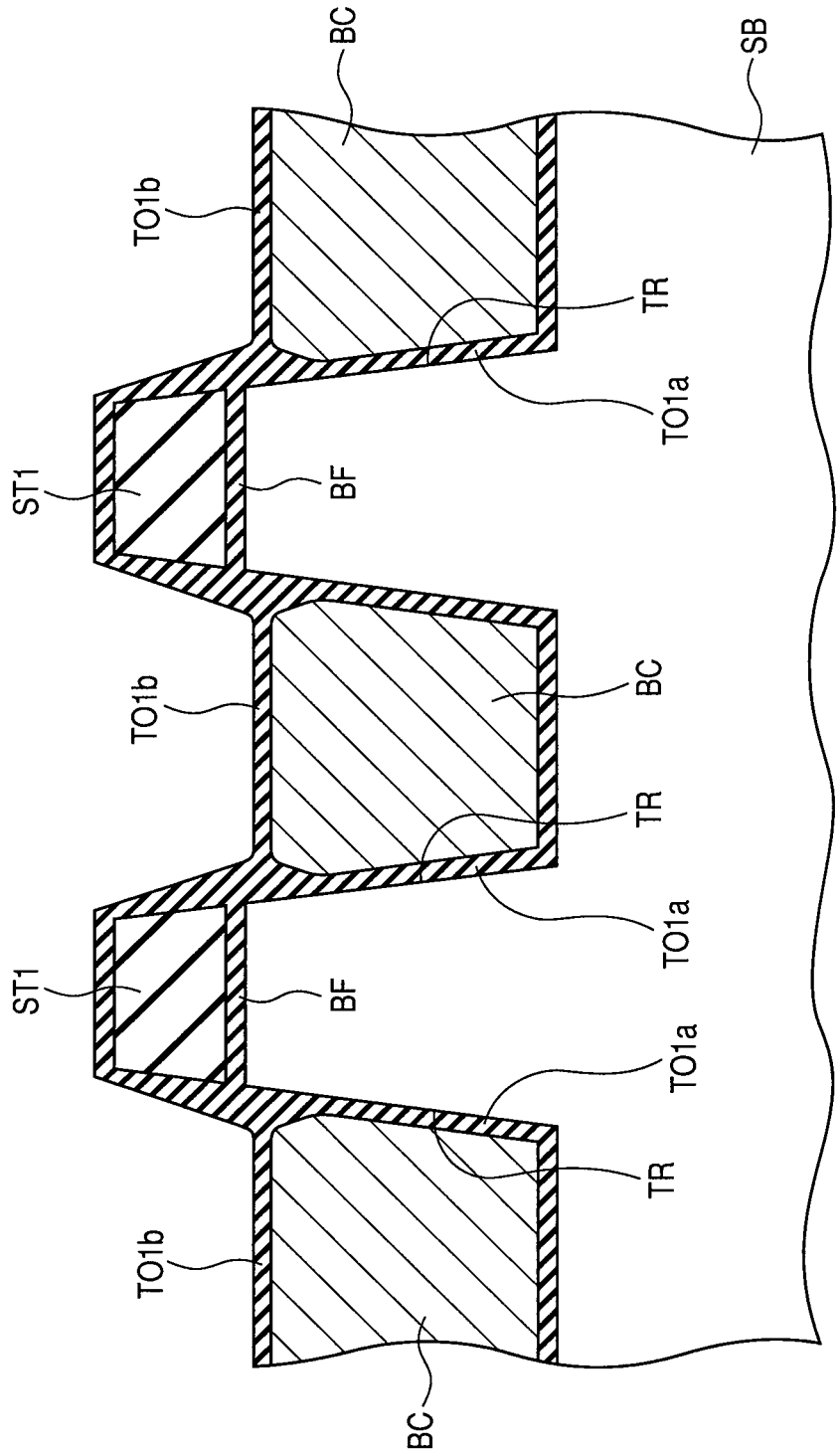
FIG. 9 is a schematic sectional view illustrating a seventh step of the manufacturing method.

Referring to FIG. 9, the workpiece is thermally oxidized in, for example, a water vapor atmosphere or oxygen atmosphere containing an active oxidizing species. By the thermal oxidation, the exposed surfaces of the embedded conductive film BC, the silicon nitride film ST1 and so on are oxidized so that the silicon oxide film TO1$b$ is formed. By the thermal oxidation, a corner portion of the upper end of the embedded conductive film BC is oxidized in each of the structure STIs, so that the thickness of the silicon oxide film TO1$a$ between the embedded conductive film BC and the trench TR is made large (the width thereof in the horizontal direction is made large). In this way, the width (film thickness) of the silicon oxide film TO1$a$ between the embedded conductive film BC and the semiconductor substrate SB in each of the structure STIs is gradually made smaller from the upper of the embedded conductive film BC toward the lower thereof, so that the first oxide film TO1$a$ is made in a tapered form.

The temperature of the thermal oxidation is from, for example, about 700 to 1050° C., and is more preferably 950° C. or lower since the oxidation at this temperature produces a larger effect of restraining the leakage current. The oxidized amount based on the thermal oxidation is required to be an amount sufficient for restraining the leakage current. However, it is preferred that the amount is not too large for the following reason: if the oxidized amount is too large, the element regions are made too small. This oxidized amount is preferably an oxidized amount corresponding to a film thickness of about 2 to 20 nm in the surface of the semiconductor substrate SB, as is seen in the oxidation in the step (illustrated in FIG. 5) of oxidizing the wall surface of each of the trenches TR.

Figure 10:
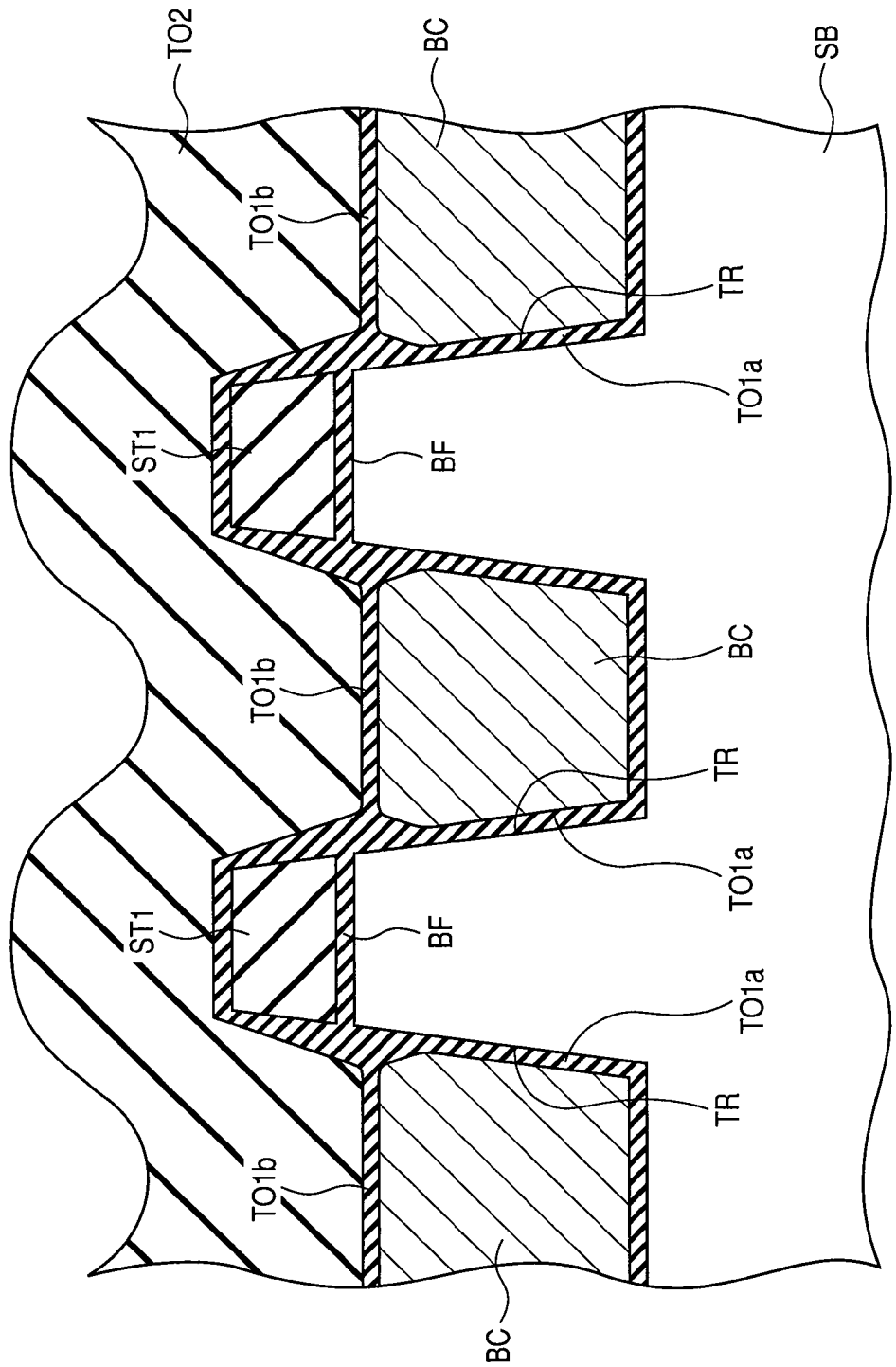
FIG. 10 is a schematic sectional view illustrating an eighth step of the manufacturing method.

Referring to FIG. 10, the silicon oxide film TO2 is formed into a film thickness of, for example, 100 to 500 nm by CVD or coating method. The surface of the silicon oxide film TO2 is subjected to CMP wherein the surface of the silicon nitride film ST1 is used as a stopper.

Referring to FIG. 11, by the CMP, the surface of the silicon nitride film ST1 is exposed, and further the silicon oxide film TO2 is caused to remain between pieces of the silicon nitride film ST1, so that the surface of the silicon oxide film TO2 and the silicon nitride film ST1 are planarized. Thereafter, the silicon nitride film ST1 is removed and further the silicon oxide films TO1$a$ and TO2 are subjected to wet etching.

Referring to FIG. 12, by the wet etching, the surface of the semiconductor substrate SB is exposed, and further in each of the structures STIs the silicon oxide film TO1a and TO2 over the trench TR are caused to remain to cap the embedded conductive film BC. Thereafter, the workpiece is subjected to ion implantation and so on for making wells and deciding the threshold value of the transistors.

Referring to FIG. 2, after the above-mentioned steps, the gate insulating film GI is formed, and then the gate electrode layer GE, the source and/or drain regions SD, and so on are formed. In this way, each MOS transistor TRA is formed. Furthermore, the workpiece is subjected to silicide-producing treatment for a decrease in the contact resistance, and others, thereby forming a silicide layer SC on the surfaces of the gate electrode layer GE and the source and/or drain regions SD in each of the MOS transistors.

Thereafter, the interlayer dielectric ID and so on are each formed into a film form, and then the interlayer dielectric ID is etched to make contact holes. A conductive film CM as a contact material is embedded into each of the contact holes. At this time, in each of the structures STI, the conductive film CM as the contact material is coupled also to the embedded conductive film BC, so that the electric potential of the embedded conductive film BC can be controlled. Furthermore, the wiring layers WR are formed on pieces of the interlayer dielectric ID. Through the wiring layers WR, the semiconductor elements (for example, the MOS transistors) are coupled to each other. In this way, the semiconductor device of the present embodiment is finished.

According to the embodiment, the thermally oxidation is performed in an active-oxygen-species-containing atmosphere; therefore, the generation of oxidation-inducing stress can be restrained at a minimum level or an extra decrease in the active regions can be avoided. Moreover, the embedded conductive film BC is restrained from short-circuiting with other regions through the silicide layer. These matters will be described hereinafter with reference to FIGS. 13(A)-13(C) to 17(A) and (B).

FIGS. 13(A) to 13(C) are views illustrating situations of the formation of oxide films in the oxidation step illustrated in FIG. 5, in which FIG. 13(A) is a view illustrating a state before any oxidation, FIG. 13(B) is a view illustrating a state when ordinary thermal oxidation is conducted, and FIG. 13(C) is a view illustrating a state when thermal oxidation using an active oxidizing species is conducted. FIGS. 13(A) to 13(C) are each an enlarged, schematic sectional view illustrating a region P0 in FIGS. 4 and 5.

Originally, an oxidizing species diffuses into a silicon oxide film when the step of oxidizing the film thermally advances. Therefore, as illustrated in FIGS. 13(A) and 13(B), when oxidation is conducted through an ordinary thermal oxidation step, an oxidizing species diffuses relatively far during the oxidation so that oxidation reaction is caused in a wide area. As a result, as illustrated in FIG. 13(B), a bird's beak extending over a long distance in the main surface direction of the semiconductor substrate (the horizontal direction in FIG. 13(B)) is generated between the semiconductor substrate SB and the silicon nitride film ST1.

When ordinary thermal oxidation is conducted, the semiconductor substrate SB is oxidized while the silicon nitride film ST1 is hardly oxidized. For this reason, the position P1 of the upper end of the trench TR (i.e., each of the trenches TR) in the semiconductor substrate SB and the position P2 of the lower end of the silicon nitride film ST1 are shifted from an imaginary line extending in the thickness direction of the silicon nitride film ST1 (the vertical direction in FIG. 13(B)), so that an offset is generated between the positions P1 and P2.

On the other hand, in thermal oxidation in an atmosphere containing an active oxidizing species, the active oxidizing species has kinetic energy besides thermal energy; thus, the oxidation advances more rapidly under a smaller thermal energy than ordinary thermal oxidation. Therefore, as illustrated in FIGS. 13(A) and 13(C), when thermal oxidation with an active oxidizing species is conducted, oxidation reaction can be sufficiently advanced while the diffusion of the oxidizing species is restrained. Thus, as illustrated in FIG. 13(C), when an oxide film having the same film thickness as obtained by ordinary thermal oxidation is obtained, a bird's beak can be restrained from extending over a long distance in the main surface direction of the semiconductor substrate SB (the horizontal direction in FIG. 13(C)) between the semiconductor substrate SB and the silicon nitride film ST1. The oxidation of extra regions can be avoided; thus, the generation of oxidation-inducing stress can be kept at a minimum level, and an extra decrease in the active regions can be avoided.

Originally, the silicon nitride film ST1 is hardly oxidized in a thermal oxidation step. However, when an active oxidizing species is used, the species causes the cleavage of bonds between silicon atoms and nitrogen atoms in the surface of the silicon nitride film ST1 to cause reaction for inserting oxygen atoms thereinto. For this reason, the surface of the silicon nitride film ST1 is oxidized so that a silicon oxide film can be grown on the surface of the silicon nitride film ST1.

As illustrated in FIG. 13(C), by the growth, a side wall of the silicon nitride film ST1 and a side wall of the trench TR in the semiconductor substrate SB are oxidized to the same degree in amount, so that the side walls retreat to the element region side (the opposite side wall side). Therefore, between the position P1 of the upper end of the trench TR in the semiconductor substrate SB and the position P2 of the lower end of the silicon nitride film ST1, a gap is hardly generated relatively to the thickness direction of the silicon nitride film ST1 (the vertical direction in FIG. 13(C))). Thus, no offset is generated between the positions P1 and P2.

Figure 15A:
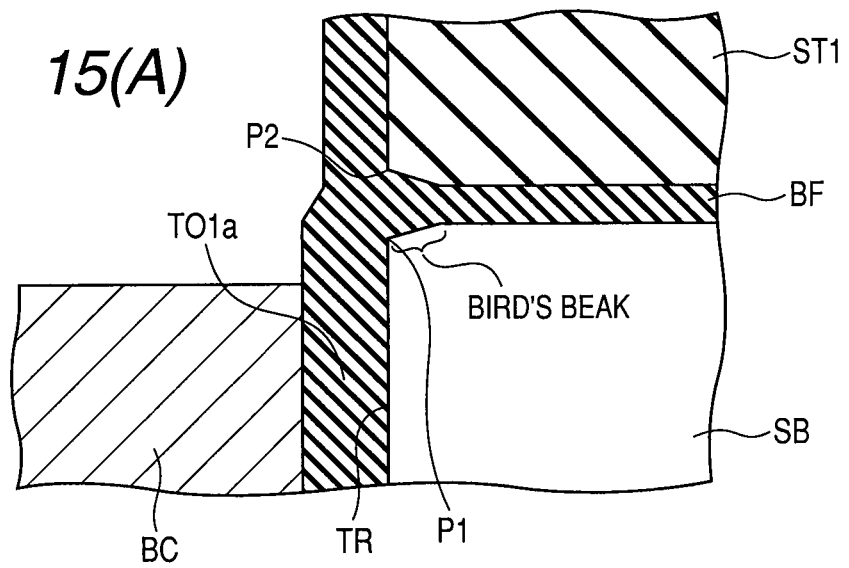
Figure 15B:
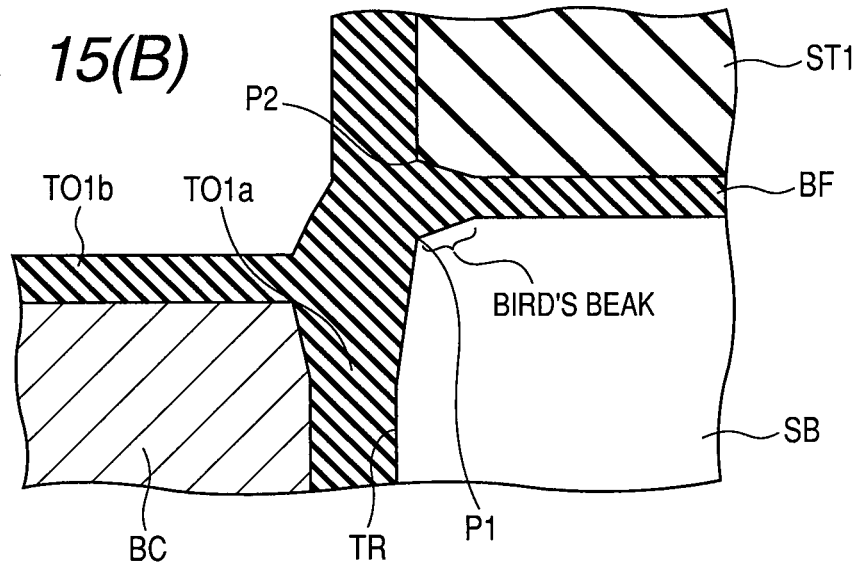

FIGS. 14(A) and 14(B) are schematic sectional views illustrating a situation of the formation of oxide films in the oxidation step illustrated in FIGS. 8 and 9 after the step illustrated in FIG. 13(B), in which FIG. 14(A) is a schematic sectional view illustrating a state before any oxidation, and FIG. 14(B) is a schematic sectional view illustrating a state when ordinary thermal oxidation is conducted. FIGS. 15(A) and 15(B) are schematic sectional views illustrating a situation of the formation of oxide films in the oxidation step illustrated in FIGS. 8 and 9 after the step illustrated in FIG. 13(C), in which FIG. 15(A) is a schematic sectional view illustrating a state before any oxidation, and FIG. 15(B) is a schematic sectional view illustrating a state when thermal oxidation is conducted in an atmosphere containing an active oxidizing species.

Firstly, referring to FIGS. 14(A) and 14(B), when oxidation is conducted through an ordinary thermal oxidation step, an oxidizing species diffuses relatively far during the oxidation so that oxidation reaction is caused in a wide area, as described above. As a result, as illustrated in FIG. 14(B), between the semiconductor substrate SB and the silicon nitride film ST1, a bird's beak extending in the main surface direction of the semiconductor substrate SB (the horizontal direction in FIG. 14(B)) becomes longer than shown in FIG. 13(B). Since the oxidized amount of the semiconductor substrate SB is large, oxidation-inducing stress also becomes large.

As described above, when ordinary thermal oxidation is conducted, the semiconductor substrate SB is oxidized while the silicon nitride film ST1 is hardly oxidized. Therefore, as illustrated in FIG. 14(B), between the position P1 of the upper end of the trench TR in the semiconductor substrate SB and the position P2 of the lower end of the silicon nitride film ST1, a larger gap is generated relatively to the thickness direction of the silicon nitride film ST1 (the vertical direction in FIG. 13(C)) than the state illustrated in FIG. 13(B). Thus, a larger offset amount is generated between the positions P1 and P2.

Secondly, referring to FIGS. 15(A) and 15(B), in thermal oxidation in an atmosphere containing an active oxidizing species, oxidation advances more rapidly under a smaller thermal energy than ordinary thermal oxidation, as described above. For this reason, oxidation reaction can be advanced while the diffusion of the oxidation species is restrained. Thus, as illustrated in FIG. 15(B), between the semiconductor substrate SB and the silicon nitride film ST1, a bird's beak can be restrained from extending over a long distance in the main surface direction of the semiconductor substrate SB (the horizontal direction in FIG. 15(B)). Moreover, between the embedded conductive film BC and the trench TR, the bird's beak can also be restrained from extending over a long distance in the thickness direction of the semiconductor substrate SB (in the vertical direction in FIG. 15(B)). Since the oxidation of extra regions can be avoided in this way, the generation of oxidation-inducing stress can be kept at a minimum level, and an extra decrease in the active regions can be avoided.

Moreover, the use of the active oxidizing species makes it possible to grow a silicon oxide film on the surface of the silicon nitride ST1 as described above. As a result, as illustrated in FIG. 15(B), a side wall of the silicon nitride film ST1 and a side wall of the trench TR in the semiconductor substrate SB are oxidized to the same degree in amount, so that the side walls retreat to the element region side (the opposite side wall side). Therefore, between the position P1 of the upper end of the trench TR in the semiconductor substrate SB and the position P2 of the lower end of the silicon nitride film ST1, a gap is hardly generated relatively to the thickness direction of the silicon nitride film ST1 (the vertical direction in FIG. 15(B))). Thus, no offset is generated between the positions P1 and P2.

Figure 16A:
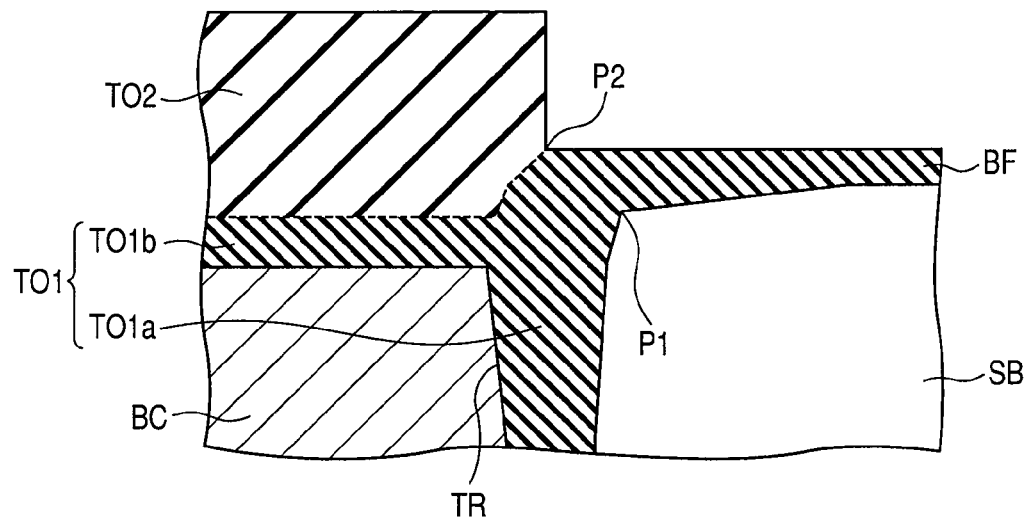
Figure 16B:
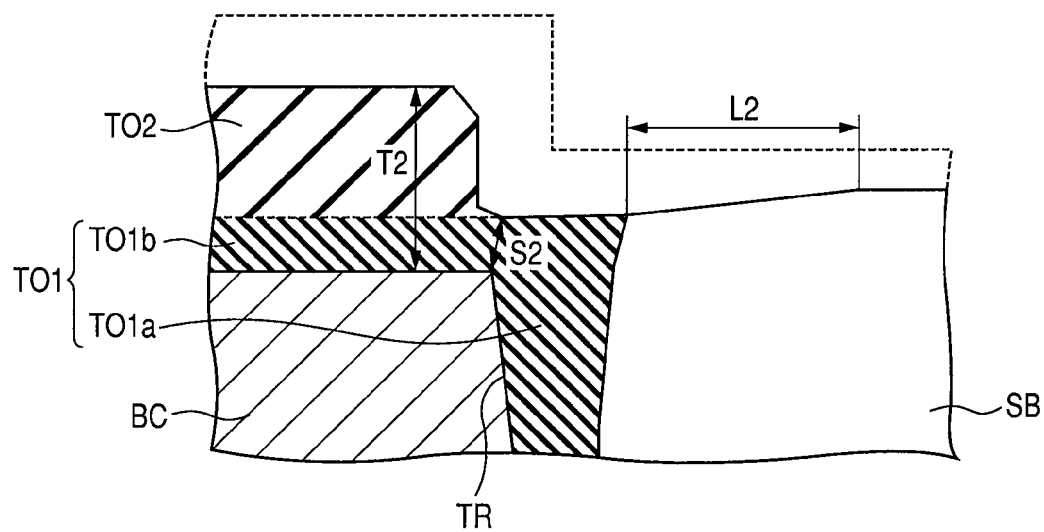
FIG. 16(B) is a view illustrating a situation when wet etching is conducted to remove the silicon oxide film after the removal of the silicon nitride film ST1.
Figure 17A:
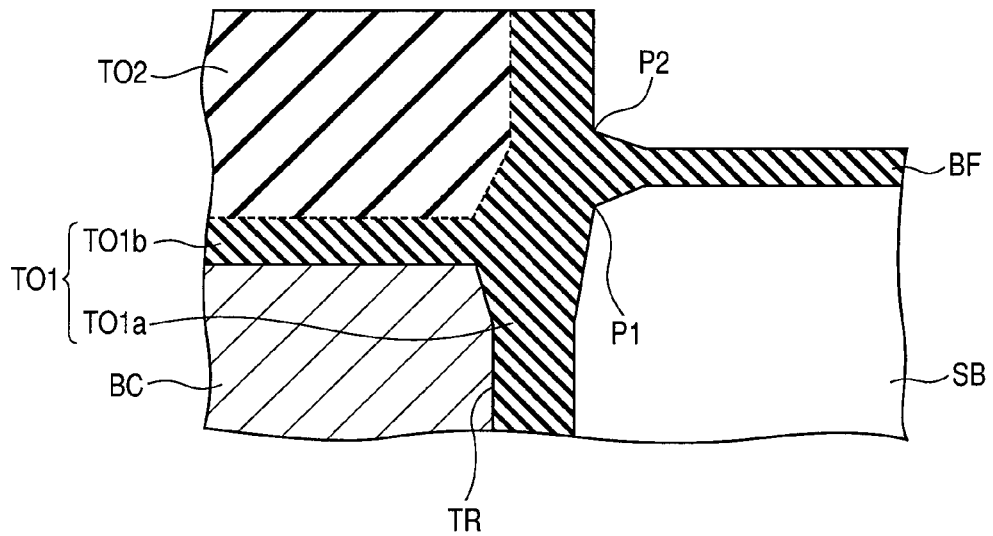

FIG. 16(A) is a view illustrating a situation after ordinary thermal oxidation as illustrated in FIG. 13(B) and FIG. 14 is conducted, the step illustrated in FIG. 11 is further conducted and then the silicon nitride film ST1 is removed, and FIG. 16(B) is a view illustrating a situation when wet etching is conducted to remove the silicon oxide film after the removal of the silicon nitride film ST1. FIG. 17(A) is a view illustrating a situation after active-oxidizing-species-used thermal oxidation as illustrated in FIG. 13(C) and FIG. 15 is conducted, the step illustrated in FIG. 11 is further conducted and then the silicon nitride film ST1 is removed, and FIG. 17(B) is a view illustrating a situation when wet etching is conducted to remove the silicon oxide film after the removal of the silicon nitride film ST1.

Referring to FIGS. 16(A) and 16(B), when ordinary thermal oxidation is conducted, a large offset is generated between the position P1 of the upper end of the trench TR and the position P2 of the lower end of the silicon nitride film ST1 as illustrated in FIG. 16(A). Therefore, as illustrated in FIG. 16(B), when the silicon oxide films TO2 and BF are wet-etched, a depression in the silicon oxide films TO2 and TO1b extends up to a region just above the embedded conductive film BC. Therefore, the distance S2 from the bottom of the depression to the embedded conductive film BC becomes small so that the surface of the embedded conductive film BC may be exposed by etching or the like in a subsequent step. When the surfaces of the source and/or drain regions SD and the gate electrode layer GE are turned to silicide in the state that the surface of the embedded conductive film BC is exposed, it is feared that the active regions and the embedded conductive film are short-circuited through the silicide layer.

Figure 17B:
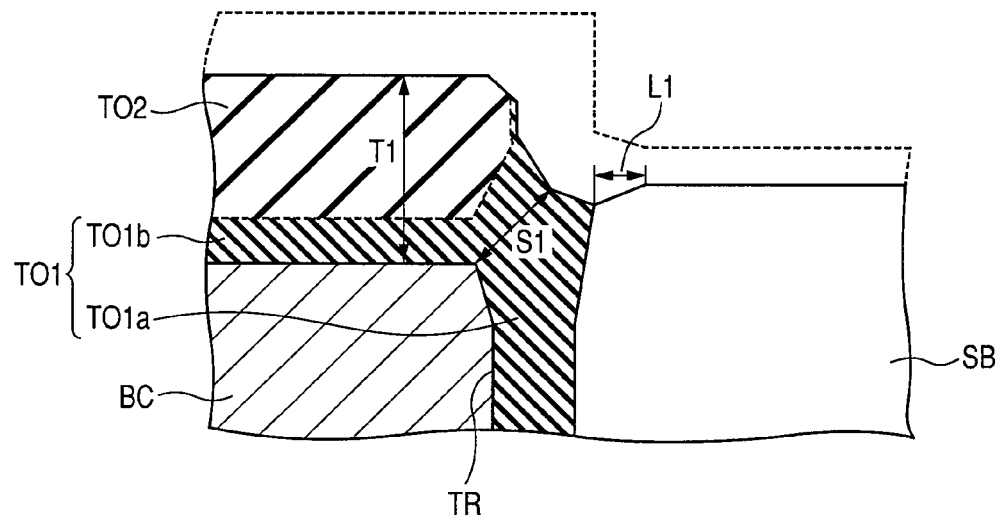
FIG. 17(B) is a view illustrating a situation when wet etching is conducted to remove the silicon oxide film after the removal of the silicon nitride film ST1.

Referring to FIGS. 17(A) and 17(B), when active-oxidizing-species-used thermal oxidation is conducted, an offset is hardly generated between the position P1 of the upper end of the trench TR and the position P2 of the lower end of the silicon nitride film ST1 as illustrated in FIG. 17(A). Therefore, as illustrated in FIG. 17(B), even when the silicon oxide films TO2 and BF are wet-etched, a depression in the silicon oxide films TO2 and TO1b does not extend up to a region just above the embedded conductive film BC. Therefore, the distance S2 from the bottom of the depression to the embedded conductive film BC becomes large so that the surface of the embedded conductive film BC is not easily exposed by etching or the like in a subsequent step. In other words, a sufficient margin can be certainly kept against the matter that the embedded conductive film BC is exposed. Thus, even when a silicide layer is formed, the embedded conductive film BC is restrained from being short-circuited with other regions through the silicide layer.

As described above, the oxidation of extra region can be avoided by conducting thermal oxidation in an active-oxidizing-species-containing atmosphere; thus, the generation of oxidation-inducing stress can be kept at a minimum level. As a result, element regions having a dimension close to a designed dimension can be obtained. Moreover, an offset is hardly generated between the position P1 of the upper end of the trench TR and the position P2 of the lower end of the silicon nitride film ST1; thus, the embedded conductive film BC is restrained from being short-circuited with other regions through the silicide layer.

Moreover, when the embedded conductive film BC is oxidized in the active-oxidizing-species-containing atmosphere, the corner portion of the upper end of the embedded conductive film BC can be deeply oxidized while the diffusion of the active oxidizing species is restrained. For this reason, the interval between the embedded conductive film BC and the impurity regions SD formed in the semiconductor substrate SB can be made large so that an electric field therebetween can be made small. As a result, a phenomenon similar to GIDL can be restrained.

Over the embedded conductive film BC, the silicon oxide film TO2 is formed as well as the silicon oxide film TO1b formed by thermal oxidation. This silicon oxide film TO2 is formed by CVD or coating method. The silicon oxide film formed by CVD or coating method has a film quality not denser than the silicon oxide film formed by thermal oxidation, and has tensile stress in reverse to the silicon oxide film formed by thermal oxidation. For this reason, the silicon oxide film TO2 gives tensile stress to the semiconductor substrate SB. By this tensile stress, the compressive stress (oxidation-inducing stress) given to the semiconductor substrate SB when the silicon oxide films TO1a and TO1b are formed by oxidation is relieved.

As described above, according to the present embodiment, a change in the electric potential of neighboring nodes and a reverse narrow channel effect can be decreased while an increase in a leakage current is avoided, the current flowing between the source and/or drain regions SD and the semiconductor substrate SB and depending on the electric potential of the embedded conductive film BC.

Figure 18:
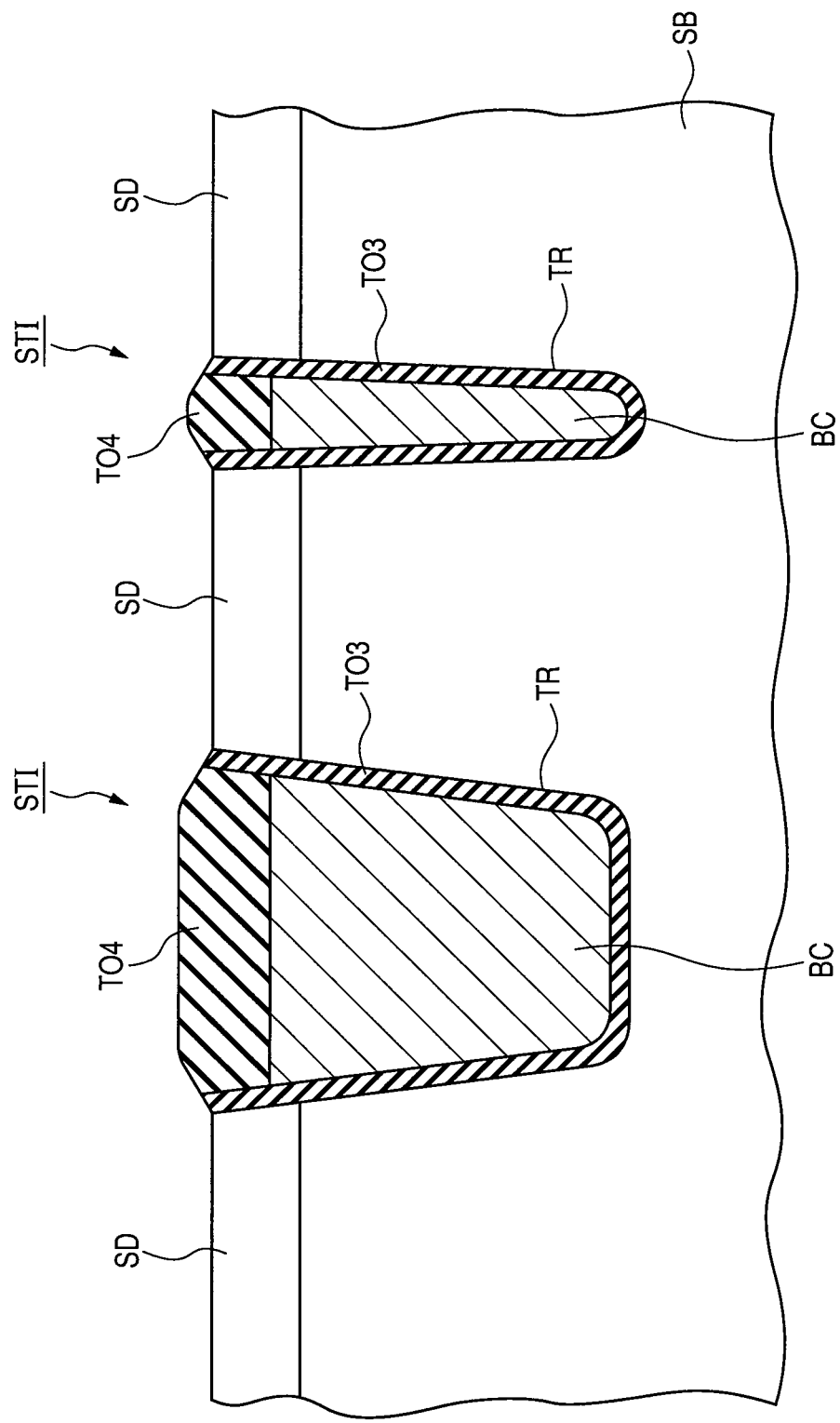
FIG. 18 is a sectional view which schematically illustrates the structure of a semiconductor device of an embodiment 2 of the invention.

Embodiment 2:

FIG. 18 is a sectional view which schematically illustrates the structure of a semiconductor device of an embodiment 2 of the invention. Referring to FIG. 18, the structure of the semiconductor device of the embodiment is different from that of the semiconductor device of the embodiment 1 illustrated in FIG. 1 mainly in the structure of an insulating film TO4 on the embedded conductive film BC in each element isolation structure STI.

This insulating film TO4 is, for example, a silicon oxide film, and is formed selectively on the embedded conductive film BC. The insulating film TO4 has tensile stress and is further formed to give tensile stress to the semiconductor substrate SB. Moreover, the insulating film TO4 is jointed to a silicon oxide film TO3 formed on the wall surface of the trench TR in each of the structures STI. In order that the insulating film TO4 will not be removed by etching or the like in a subsequent step, the film thickness of the insulating film TO4 is preferably about 50 nm.

Figure 19:
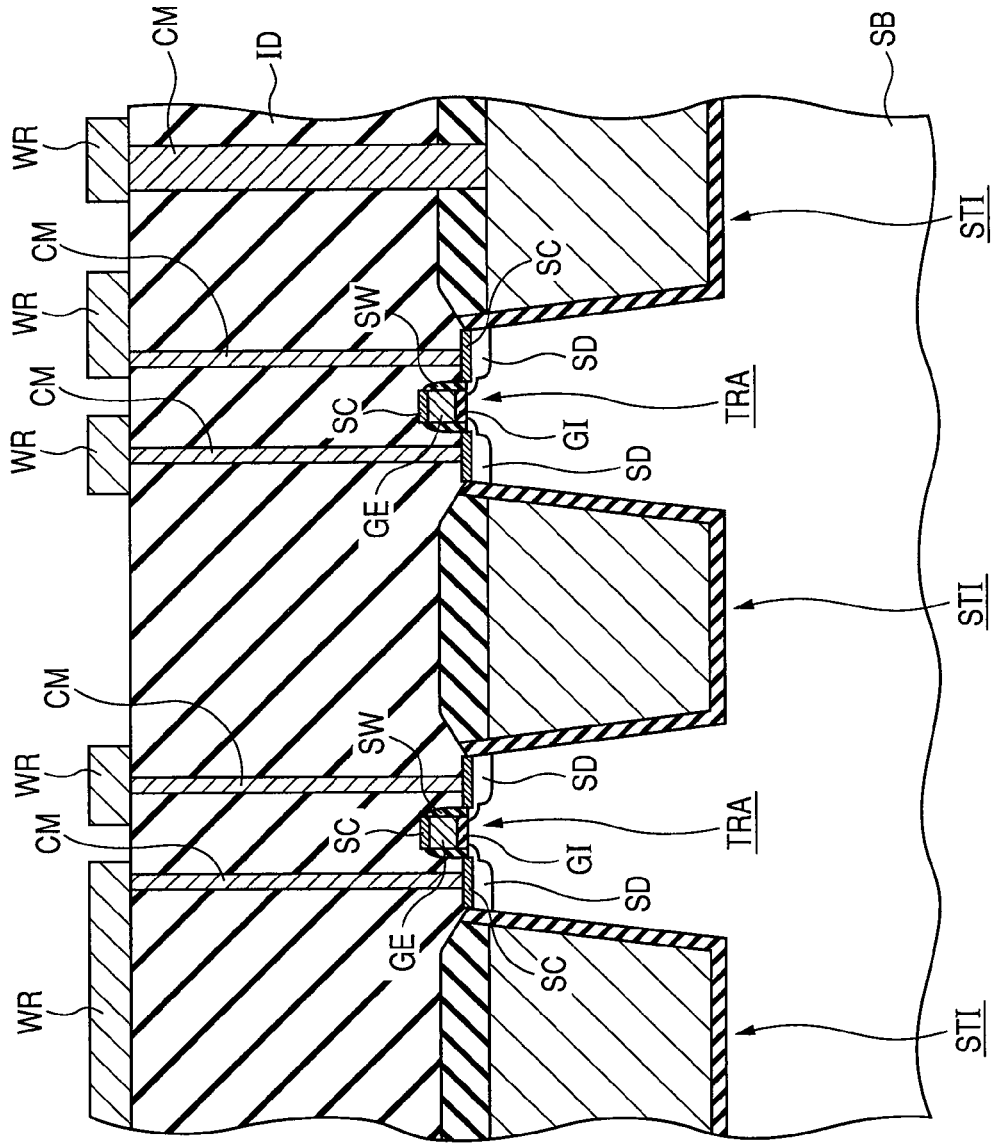
FIG. 19 is a sectional view which schematically illustrates a structure wherein the element isolation structures illustrated in FIG. 18 are used to isolate MOS transistors electrically from each other.

A structure wherein the element isolation structures STI illustrated in FIG. 18 are used to isolate MOS transistors electrically from each other is illustrated in FIG. 19.

The constituent elements of the embodiment illustrated in FIGS. 18 and 19 other than the above are substantially equivalent to those of the embodiment 1; thus, the same reference symbols or numbers are attached to the same elements, and description thereof is not repeated.

With reference to some of the attached drawings, a method for manufacturing the semiconductor device of the embodiment 2 will be described hereinafter.

Figure 20:
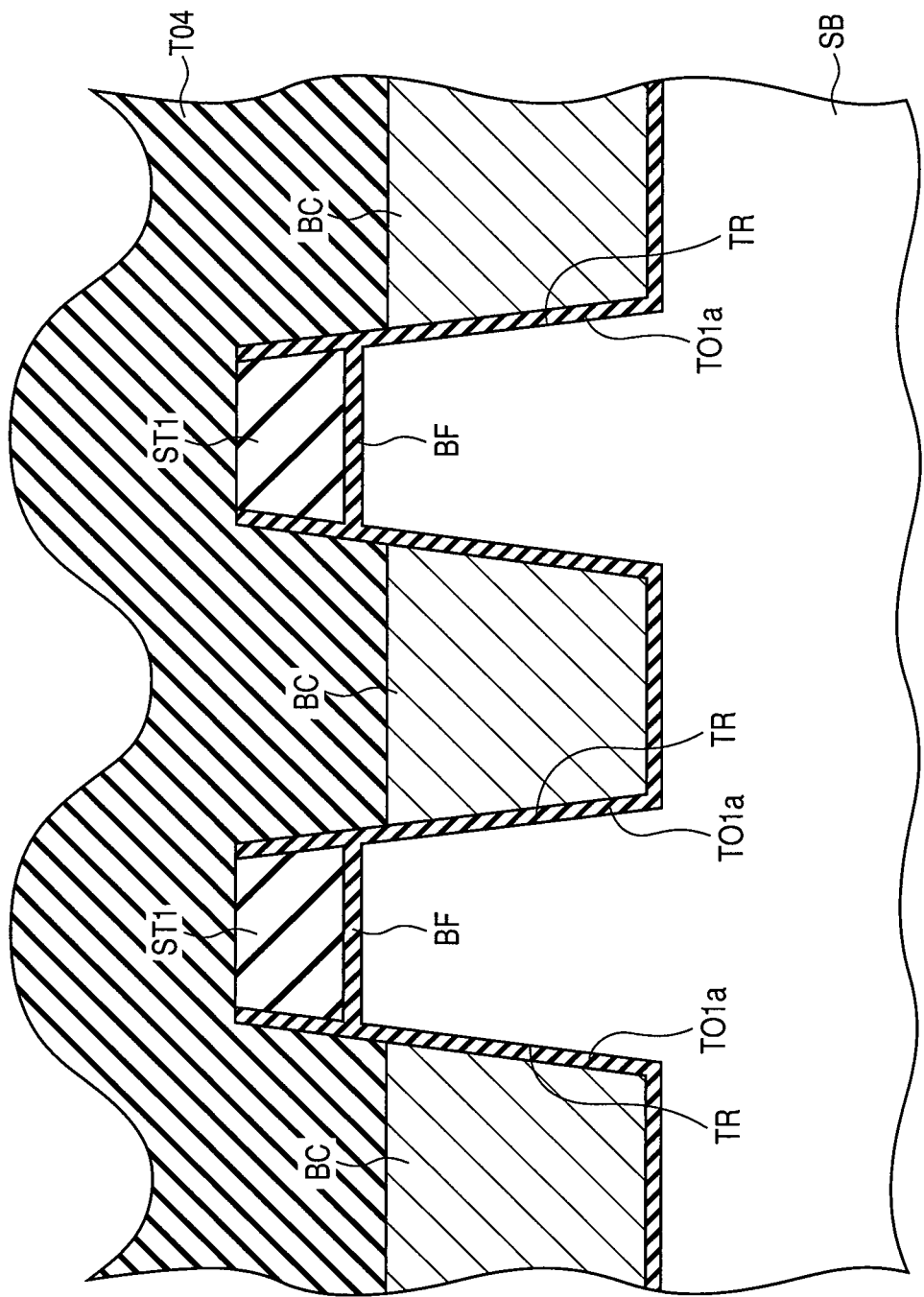
FIG. 20 is a schematic sectional view illustrating a first step of a manufacturing method of the semiconductor device of the embodiment 2 of the invention.
Figure 21:
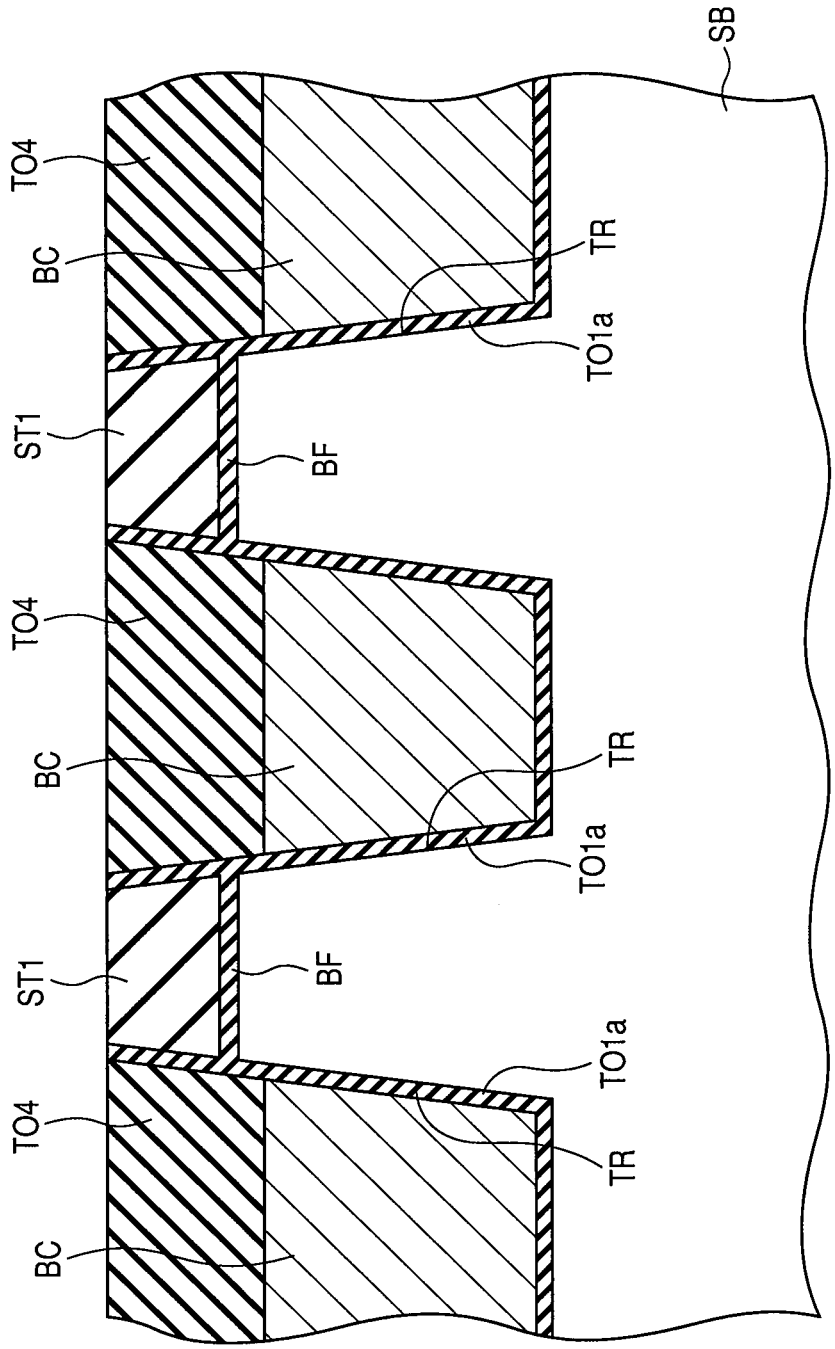
FIG. 21 is a schematic sectional view illustrating a second step of the manufacturing method of the semiconductor device.
Figure 22:
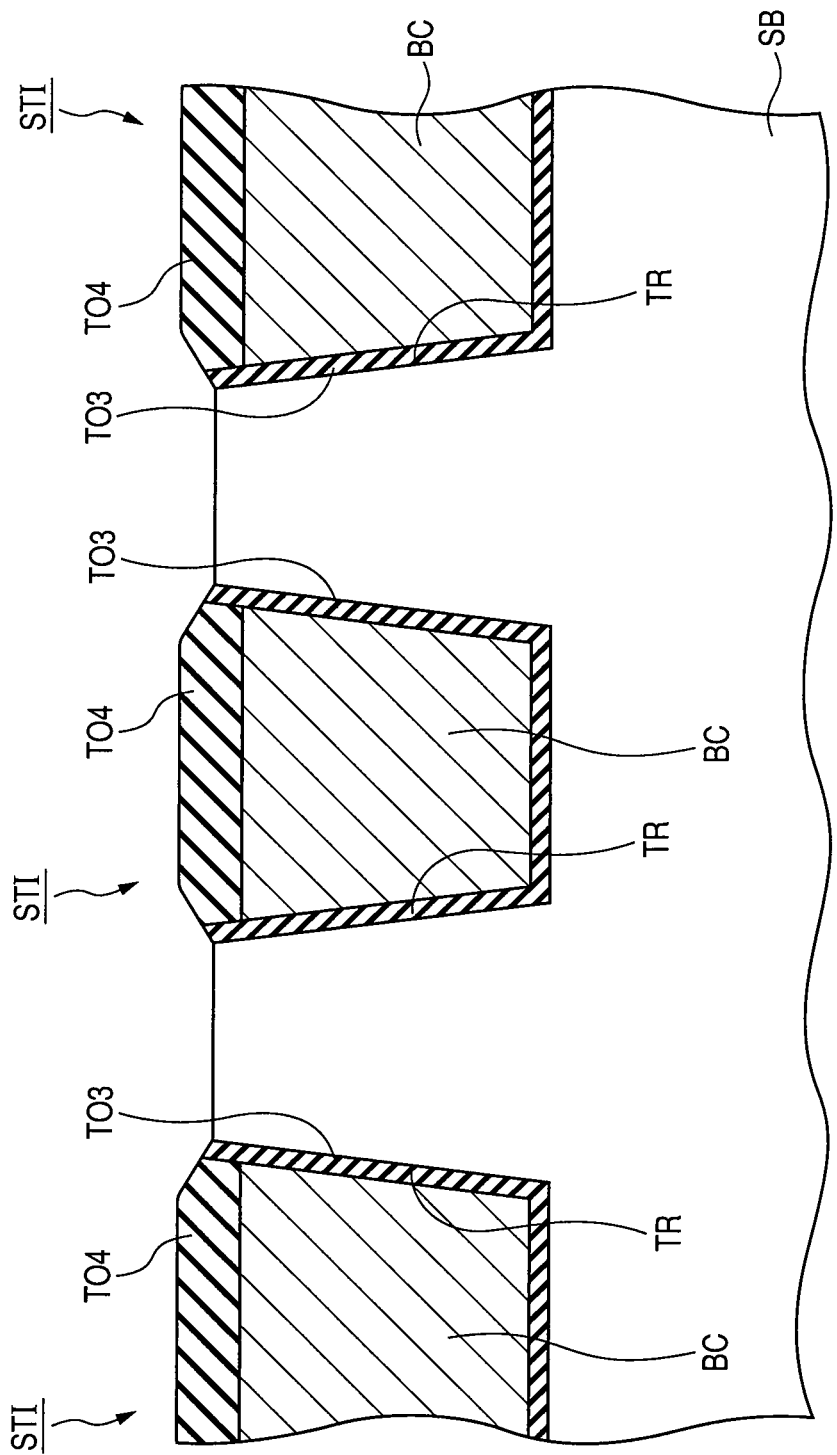
FIG. 22 is a schematic sectional view illustrating a third step of the manufacturing method of the semiconductor device.

FIGS. 20 to 22 are schematic sectional views illustrating the process in order of steps therein. The method for manufacturing the semiconductor device of the embodiment 2 is advanced by way of the producing steps in the embodiment 1 illustrated in FIGS. 3 to 8. Referring to FIG. 20, after the steps, the insulating film TO4 having tensile stress is formed into a thickness of, for example, 100 to 500 nm. The insulating film TO4 may be formed as, for example, a silicon oxide film by SA(sub-atmospheric)-CVD at a film-forming temperature of, for example, 400 to 600° C. (preferably, 520 to 560° C.). The insulating film TO4 may be formed by forming a polysilazane film in a coating method manner, and then annealing the polysilazane film at a temperature of, for example, 700 to 800° C. in order to convert the film into a silicon oxide film. The surface of the insulating film TO4 is then subjected to CMP wherein the silicon nitride film ST1 is used as a stopper.

Referring to FIG. 21, by the CMP, the surface of the silicon nitride film ST1 is exposed, and further the insulating film TO4 is caused to remain between the pieces of the silicon nitride film ST1. In this way, the surfaces of the insulating film TO4 and the silicon nitride film ST1 are planarized. Thereafter, the silicon nitride film ST1 is removed and further the silicon oxide film TO3 and the insulating film TO4 are wet-etched.

Referring to FIG. 22, by the wet etching, the surface of the semiconductor substrate SB is exposed and further the insulating film TO4 is caused to remain over the trench TR to cap the embedded conductive film BC in each of the structures STI. Thereafter, the workpiece undergoes the same steps as in the embodiment 1, so as to finish the semiconductor device of the embodiment 2 illustrated in FIG. 19.

According to the embodiment 2, the insulating film TO4, which has a larger tensile stress than insulating films formed by ordinary CVD, is formed over the embedded conductive film BC. According to this manner, the compressive stress applied to element regions by the embedded conductive film BC is decreased by the tensile stress of the insulating film TO4, thereby making it possible to restrain the band gap of the silicon from being narrowed. As a result, a leakage current flowing between the source and/or drain regions SD and the semiconductor substrate SB can be restrained.

According to the embodiment 2, the compressive force applied to the element regions by the embedded conductive film BC can be decreased; thus, the layout-dependency of the drain current can be decreased.

According to the embodiment 2, the isolating film TO4 is formed not by thermal oxidation, but by, for example, SACVD or coating method. Therefore, the element regions are not excessively oxidized by thermal oxidation, so that the element regions can be element regions having a dimension close to a designed dimension.

As described above, according to the embodiment 2, an increase in a leakage current is avoided, the current flowing between the source and/or drain regions SD and the semiconductor substrate SB and depending on the electric potential of the embedded conductive film BC, while a change in the electric potential of neighboring nodes and a reverse narrow channel effect can be decreased.

In the embodiment 2, the second insulating film TO4 is not limited to the silicon oxide film, and may be any insulating film having tensile stress.

The embodiment 2 may be applied also to the embodiment 1. For example, in the case of performing the same step as illustrated in FIG. 9 in the embodiment 1 and then forming the insulating film TO4, which has tensile stress, the same advantageous effects as in the embodiment 1 can be obtained.

It should be understood that the embodiments disclosed herein are exemplificative in all ways and are not restrictive. The scope of the present invention is specified not by the above-mentioned description but by the claims, and all variations and modifications having a meaning and scope equivalent to those of the claims are intended to be included in the scope of the invention.

The invention is particularly useful for a semiconductor device having trench-type element isolation structures, and a method for manufacturing the semiconductor device.

What is claimed is:

1. A manufacturing method of a semiconductor device, comprising:
    making a trench in a main surface of a semiconductor substrate;
    oxidizing a wall surface of the trench in an atmosphere containing an active oxidizing species, thereby forming a first oxide film on the wall surface;
    forming an embedded conductive film so as to be embedded into the trench, the wall surface of which being covered with the first oxide film;
    oxidizing the embedded conductive film in an atmosphere containing an active oxidizing species, thereby forming a second oxide film; and
    forming a third oxide film having tensile stress over the second oxide film, the third oxide film formed only right over the embedded conductive film,
    wherein in the oxidizing the embedded conductive film, a tapered region, having a width which is made smaller in a direction extending from where the first oxide film is jointed to the second oxide film at an upper portion of the embedded conductive film towards a lower portion of the embedded conductive film, is formed in the first oxide film, and
    wherein in the forming the embedded conductive film, an upper surface of the embedded conductive film is lower than the main surface of the semiconductor substrate.

2. The manufacturing method of a semiconductor device according to claim 1, wherein the third oxide film is formed by one of sub-atmospheric chemical vapor deposition and coating method.

3. The method of manufacturing the semiconductor device according to claim 1, wherein the third oxide film is in contact with the second oxide film.

4. A manufacturing method of a semiconductor device, comprising the steps of:
- making a trench in a main surface of a semiconductor substrate;
- oxidizing a wall surface of the trench in an atmosphere containing an active oxidizing species, thereby forming a first oxide film on the wall surface;
- forming an embedded conductive film so as to be embedded into the trench, the wall surface of which being covered with the first oxide film;
- oxidizing the embedded conductive film in an atmosphere containing an active oxidizing species, thereby forming a second oxide film; and
- forming a third oxide film having tensile stress over the second oxide film, the third oxide film formed only right over the embedded conductive film.

5. The manufacturing method of the semiconductor device according to claim 4,
- wherein, in the making the trench, the trench is made by etching the semiconductor substrate and a nitride film formed over the semiconductor substrate.

6. The manufacturing method of the semiconductor device according to claim 4,
- wherein, in the oxidizing the wall surface of the trench, the wall surface of the trench in the nitride film is oxidized.

* * * * *